(12) United States Patent
Kamino et al.

(10) Patent No.: US 9,564,466 B2
(45) Date of Patent: Feb. 7, 2017

(54) SEMICONDUCTOR DEVICE AND MANUFACTURING METHOD THEREOF

(71) Applicant: Renesas Electronics Corporation, Kawasaki-shi, Kanagawa (JP)

(72) Inventors: Takeshi Kamino, Kanagawa (JP); Yotaro Goto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/804,290

(22) Filed: Jul. 20, 2015

(65) Prior Publication Data

US 2016/0043131 A1 Feb. 11, 2016

(30) Foreign Application Priority Data

Aug. 6, 2014 (JP) .................................. 2014-160870

(51) Int. Cl.
| | | |
|---|---|---|
| *H01L 27/146* | (2006.01) | |
| *H01L 21/265* | (2006.01) | |
| *H01L 29/66* | (2006.01) | |
| *H01L 21/311* | (2006.01) | |

(52) U.S. Cl.
CPC ....... *H01L 27/14643* (2013.01); *H01L 21/265* (2013.01); *H01L 21/31116* (2013.01); *H01L 27/1462* (2013.01); *H01L 27/14607* (2013.01); *H01L 27/14614* (2013.01); *H01L 27/14689* (2013.01); *H01L 29/6659* (2013.01); *H01L 29/66568* (2013.01); *H01L 21/26513* (2013.01); *H01L 21/26586* (2013.01)

(58) Field of Classification Search
CPC ........... H01L 27/1462; H01L 27/14643; H01L 27/14614; H01L 27/14607; H01L 27/14689; H01L 29/6659; H01L 29/66568; H01L 21/31116; H01L 21/265; H01L 21/26513
USPC .............................................. 257/225; 438/60
See application file for complete search history.

(56) References Cited

U.S. PATENT DOCUMENTS

| | | | |
|---|---|---|---|
| 7,728,330 B2 | 6/2010 | Li | |
| 7,935,557 B2 | 5/2011 | Mishima et al. | |
| 8,854,518 B2 * | 10/2014 | Oike ................. | H01L 27/14609 348/297 |
| 2006/0255382 A1 * | 11/2006 | Rhodes ............. | H01L 27/14603 257/292 |

(Continued)

FOREIGN PATENT DOCUMENTS

| | | |
|---|---|---|
| JP | 2009-506542 A | 2/2009 |
| JP | 2010-161236 A | 7/2010 |

*Primary Examiner* — Yasser A Abdelaziez
(74) *Attorney, Agent, or Firm* — Shapiro, Gabor and Rosenberger, PLLC

(57) ABSTRACT

Provided is a semiconductor device with improved performance. The semiconductor device includes a photodiode having a charge storage layer (n-type semiconductor region) and a surface layer (p-type semiconductor region), and a transfer transistor having a gate electrode and a floating diffusion. The surface layer (p-type semiconductor region) of a second conductive type formed over the charge storage layer (n-type semiconductor region) of a first conductive type includes a first sub-region having a low impurity concentration, and a second sub-region having a high impurity concentration. The first sub-region is arranged closer to the floating diffusion than the second sub-region.

8 Claims, 27 Drawing Sheets

(56) References Cited

U.S. PATENT DOCUMENTS

| | | | |
|---|---|---|---|
| 2010/0032749 A1* | 2/2010 | Shrivastava et al. | H01L 21/26586 257/328 |
| 2013/0140626 A1* | 6/2013 | Shrivastava | H01L 21/26586 257/328 |
| 2015/0357370 A1* | 12/2015 | Yamaguchi | H01L 27/14689 438/60 |

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2014-160870 filed on Aug. 6, 2014 including the specification, drawings and abstract is incorporated herein by reference in its entirety.

BACKGROUND

The present invention relates to semiconductor devices and manufacturing methods thereof, and more particularly to a technique that can be suitably applied to a method for manufacturing a semiconductor device including, for example, a solid-state imaging element.

Solid-state imaging elements using a complementary metal oxide semiconductor (CMOS), namely the so-called "CMOS image sensors" have been developed as a typical solid-state imaging element. The CMOS image sensor includes a plurality of pixels, each having a photodiode and a transfer transistor.

Japanese Unexamined Patent Application Publication No. 2010-161236 (Patent Document 1) discloses the invention which relates to a manufacturing method of a photoelectric converter that reduces an etching damage to a photoelectric conversion portion, thereby improving the accuracy of control of an offset in a protective region of the photoelectric conversion portion.

Japanese Translation of PCT International Application Publication No. JP-T-2009-506542 (Patent Document 2) discloses the invention in which a gate oxynitride film having a thickness twice that of a general gate oxynitride film is provided over a photosensitive region of a CMOS imager to reduce the reflection of photons on a surface of a photosensor, resulting in reduction of dark current.

RELATED ART DOCUMENTS

Patent Documents

[Patent Document 1]
Japanese Unexamined Patent Application Publication No. 2010-161236
[Patent Document 2]
Japanese Translation of PCT International Application Publication No. JP-T-2009-506542

SUMMARY

Semiconductor devices with the photodiode are also desired to improve their performance, for example, to reduce dark current, white defects in dark time, and the like.

Other problems and new features of the present invention will be clearly understood by the following detailed description of the present specification in coupling with the accompanying drawings.

According to one embodiment of the invention, a semiconductor device is provided which includes: a photodiode having a charge storage layer and a surface layer, and a transfer transistor having a gate electrode and a floating diffusion. The surface layer of a second conductive type that is formed over the charge storage layer of a first conductive type includes a first sub-region having a low impurity concentration, and a second sub-region having a high impurity concentration. The first sub-region is arranged closer to the floating diffusion than the second sub-region.

Therefore, in the one embodiment of the present invention, the performance of the semiconductor device can be improved.

DETAILED DESCRIPTION

Figure 1:
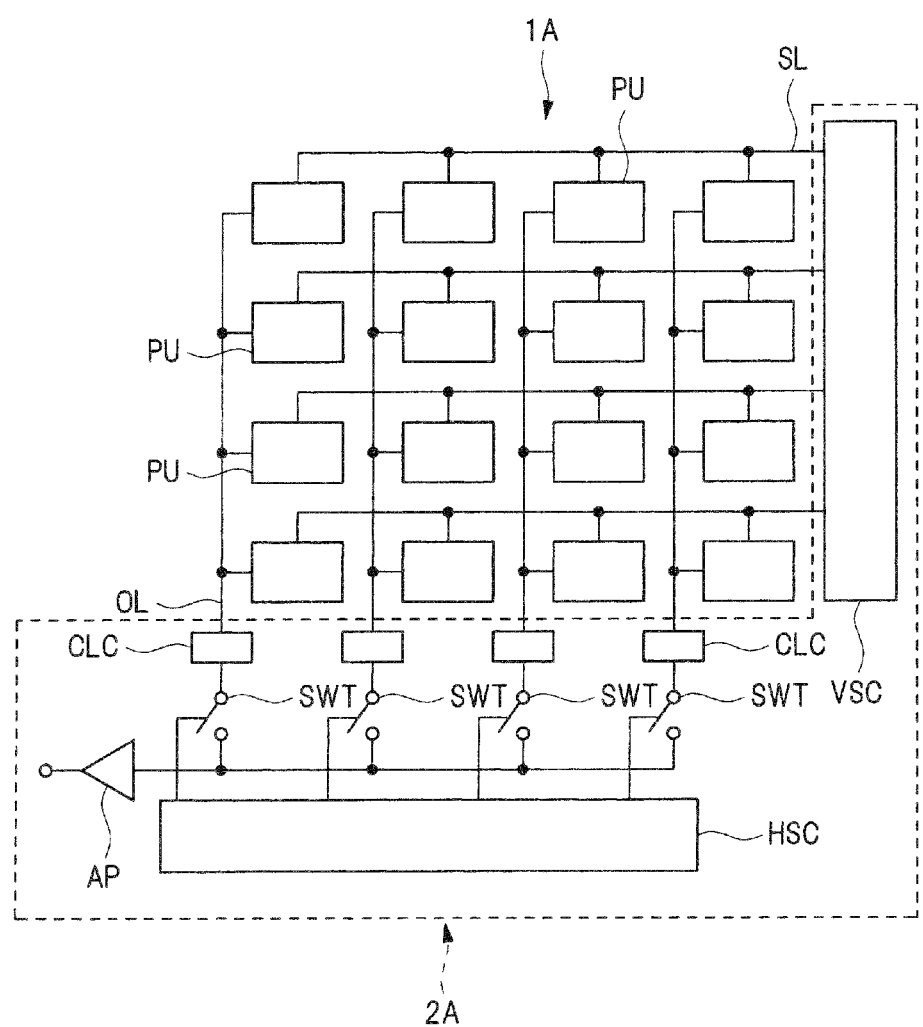
FIG. 1 is a circuit block diagram showing an example of the configuration of a semiconductor device according to a first embodiment of the invention.

The following preferred embodiments of the invention may be described below by being divided into a plurality of sections or embodiments for convenience, if necessary, which are not independent from each other unless otherwise specified. One of the sections or embodiments may be a modified example, a detailed description, supplementary explanation, and the like of a part or all of the other. Even when referring to a specific number about an element and the like (including the number of elements, a numerical value, an amount, a range, and the like) in the following embodiments, the invention is not limited to the specific number, and may take the number greater than, or less than the specific numeral number, unless otherwise specified, and except when limited to the specific number in principle. It is obvious that the components (including elemental steps and the like) in the embodiments below are not necessarily essential unless otherwise specified, and except when clearly considered to be essential in principle. Likewise, when referring to the shape, positional relationship etc., of the components or the like in the following embodiments, any shape or positional relationship substantially similar or approximate to that described herein may be included in the invention unless otherwise specified and except when clearly considered not to be so in principle. The same goes for the above numerical value and range.

Some embodiments of the present invention will be described in detail below based on the accompanying drawings. In all drawings for explaining the embodiments, parts having the same function are indicated by the same or similar reference characters, and the repeated description thereof will be omitted. In the following embodiments, the same or similar parts will not be repeatedly described in principle unless absolutely necessary.

In the accompanying drawings used in the embodiments, even some cross-sectional views may omit hatching for better understanding. Even some plan views may be designated by hatching for easy understanding.

First Embodiment

In the following, the structure and manufacturing process of a semiconductor device according to a first embodiment of the invention will be described in detail with reference to the accompanying drawings. In the first embodiment, a description will be given of an example in which the semiconductor device is a surface-irradiation type CMOS image sensor designed to allow light to enter from a surface side of a semiconductor substrate.

<Structure of Semiconductor Device>

Figure 2:
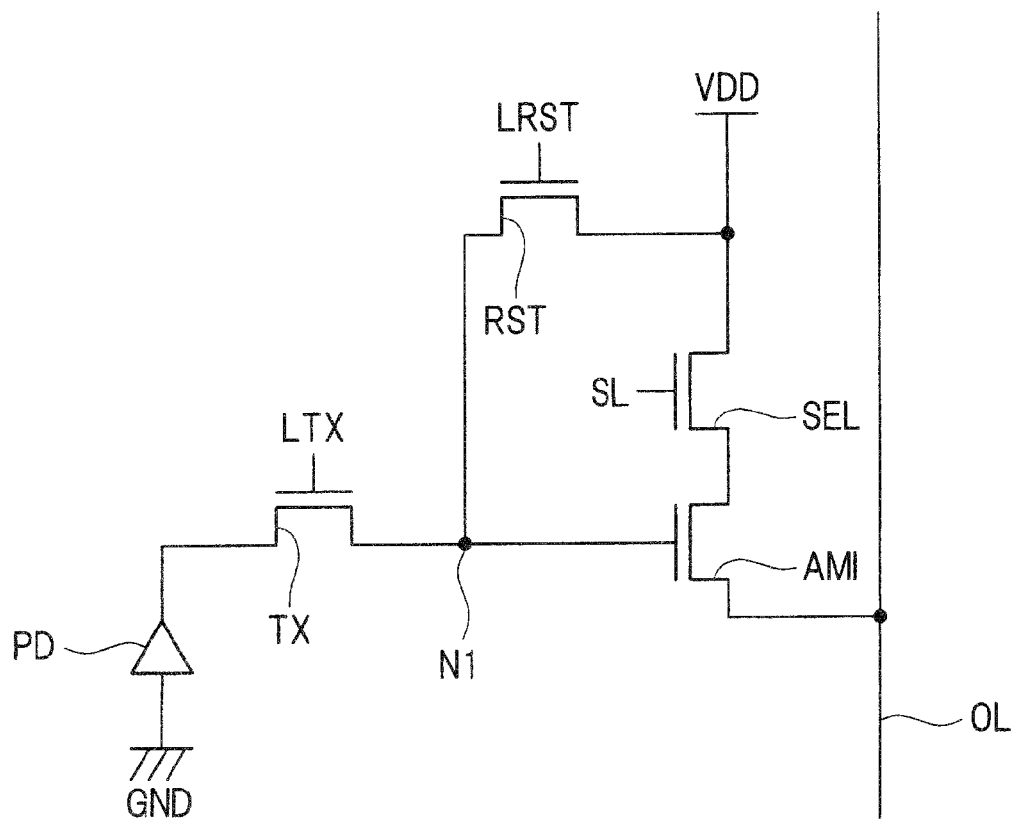
FIG. 2 is a circuit diagram showing an example of the configuration of a pixel of the semiconductor device in the first embodiment of the invention.

FIG. 1 is a circuit block diagram showing an example of the configuration of a semiconductor device in the first embodiment of the invention. FIG. 2 is a circuit diagram showing an example of the configuration of a pixel. FIG. 1 illustrates 16 pixels arranged in an array (or matrix) of four rows and four columns (4×4). The number of pixels is not limited thereto, and can be changed. For example, the sequence number of pixels actually used in electronic devices, such as a camera, is several hundreds.

In a pixel region 1A shown in FIG. 1, a plurality of pixels PU are arranged in an array, and a peripheral circuit region 2A, which is enclosed by a broken line in the figure, is positioned around the pixels. The peripheral circuit region 2A include driving circuits, such as a vertical scanning circuit VSC and a horizontal scanning circuit HC, column circuits CLC, switches SWT, and an output amplifier AP. Each pixel (cell, pixel unit) PU is arranged at the intersection of a selection line SL and an output line OL. The selection lines SL are coupled to the vertical scanning circuit VSC, and the output lines OL are coupled to the respective column circuits CLC. Each column circuit CLC is coupled to the output amplifier AP via the corresponding switch SWT. Each switch SWT is coupled to the horizontal scanning circuit HSC, and controlled by the horizontal scanning circuit HSC.

For example, an electric signal read from the pixel PU selected by the vertical scanning circuit VSC and the horizontal scanning circuit HSC is output via the output line OL and the output amplifier AP.

As shown in FIG. 2, for example, the structure of the pixel PU is included of a photodiode PD, and four transistors RST, TX, SEL, and AMI. Each of these transistors RST, TX, SEL, and AMI is formed of an n-channel type metal insulator semiconductor field effect transistor (MIFET). Among them, the transistor RST is a reset transistor (transistor for reset), the transistor TX is a transfer transistor (transistor for transfer), the transistor SEL is a selection transistor (transistor for selection), and the transistor AMI is an amplification transistor (transistor for amplification). Note that the transfer transistor TX is a transistor for transfer that is adapted to transfer charges generated by the photodiode PD to a node N1. In addition to these transistors, other transistors or elements, such as a capacity element, can also be incorporated. The form of coupling of these transistors can be variously modified and applied.

In the example of the circuit shown in FIG. 2, the photodiode PD and the transfer transistor TX are coupled in series between a ground potential GND and the node N1. The reset transistor RST is coupled between the node N1 and a power source potential (power source potential wiring) VDD. The selection transistor SEL and the amplification transistor AMI are coupled in series between the power source potential VDD and the output line OL. A gate electrode of the amplification transistor AMI is coupled to the node N1. A gate electrode of the reset transistor RST is coupled to a reset line LRST. A gate electrode of the selection transistor SEL is coupled to the selection line SL, and a gate electrode of the transfer transistor TX is coupled to a transfer line (second selection line) LTX.

For example, the transfer line LTX and the reset line LRST are boosted (set to a high level H), and the transfer transistor TX and the reset transistor RST are turned on. As a result, the charges are released from the photodiode PD, which is depleted. Then, the transfer transistor TX is turned off.

Thereafter, for example, if a mechanical shutter of an electronic device, such as a camera, is opened, charges are generated by incident light and stored in the photodiode PD while the shutter is opened. That is, the photodiode PD receives the incident light and generates electric charges.

Next, after closing the shutter, the reset line LRST is boosted (set to a low level L), and the reset transistor RST is turned off. Further, the selection line SL and the transfer line LTX are boosted (set to a high level H), and the selection transistor SEL and the transfer transistor TX are turned on. Thus, the charges generated by the photodiode PD are transferred to the end of the transfer transistor TX on the side of the node N1 (corresponding to the floating diffusion FD shown in FIG. 3 to be described later). At this time, the potential of the floating diffusion FD changes to a value according to the charges transferred from the photodiode PD. The value is amplified by the amplification transistor AMI and represented on the output line OL. The potential of the output line OL is converted into an electric signal (light receiving signal), and read as an output signal from the output amplifier AP via the column circuit CLC and the switch SWT.

Figure 3:
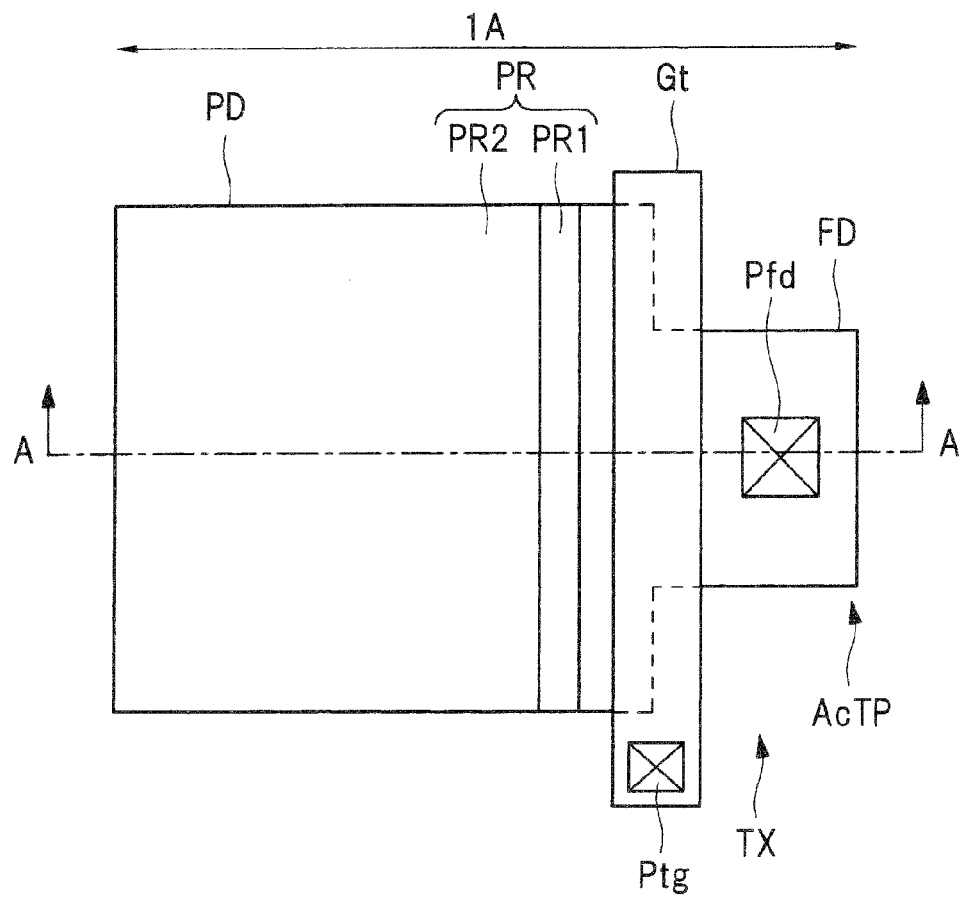
FIG. 3 is a plan view showing a photodiode PD and a transfer transistor TX which are parts of the pixel of the semiconductor device in the first embodiment of the invention.

FIG. 3 is a plan view showing the photodiode PD and the transfer transistor TX which are included in the pixel of the semiconductor device in the first embodiment.

As shown in FIG. 3, the photodiode PD and the transfer transistor TX included in the pixel PU of the semiconductor device in the first embodiment are formed in an active region AcTP.

In the planar view, the gate electrode Gt is arranged across the active region AcTP, and the photodiode PD is arranged on one of both sides of the gate electrode Gt, while the floating diffusion FD is arranged on the other. Although the photodiode PD is a PN junction diode, and includes, for example, a plurality of n-type and p-type impurity diffusion regions (semiconductor regions), FIG. 3 illustrates sub-regions PR1 and PR2 configuring a surface layer, which is a p-type semiconductor region of the photodiode PD. The floating diffusion FD has a function of serving as a charge storage portion or a floating diffusion layer, and is included of, for example, an n-type impurity diffusion region (semiconductor region). A plug Pfd is arranged over the floating diffusion FD, and a plug Ptg is arranged over the gate electrode Gt.

The plugs Pfd and Ptg and a plurality of the wiring layers (for example, wirings M1 to M3 to be described with reference to FIG. 5) couple the transfer transistor TX and the photodiode PD to another transistor, so that the circuit shown in FIG. 2 can be formed.

Figure 4:
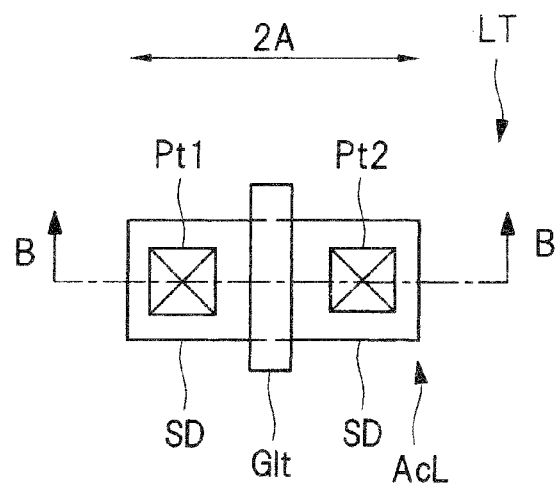
FIG. 4 is a plan view showing a transistor formed in a peripheral circuit region of the semiconductor device in the first embodiment of the invention.

FIG. 4 shows a plan view of a transistor formed in the peripheral circuit region 2A of the semiconductor device in the first embodiment.

In the peripheral circuit region 2A, there are provided a plurality of n-channel MISFETs and p-channel MISFETs as transistors forming a logical circuit. However, for better understanding, FIG. 4 illustrates only one n-channel MISFET which is one of the transistors forming the logical circuit, as a peripheral transistor LT.

A shown in FIG. 4, in the peripheral circuit region 2A, the active region AcL is formed, and the gate electrode Glt of the peripheral transistor LT is arranged across the active region AcL. Source and drain regions for the peripheral transistor LT including an $n^+$-type semiconductor region SD to be described later are formed on both sides of the gate electrode Glt within the active region AcL. Plugs Pt1 and Pt2 are arranged over the source and drain regions of the peripheral transistor LT.

Although FIG. 4 illustrates only one peripheral transistor LT, a plurality of transistors are actually arranged in the peripheral circuit region 2A. The plugs over the source and drain regions, or the plugs over the gate electrode Glt in the transistors are coupled together by a plurality of wiring layers (wirings M1 to M3 to be described later), thereby enabling formation of the logical circuit. An element other than the MISFET, such as a capacity element or a transistor with another structure, is incorporated in the logical circuit in some cases.

Note that although the peripheral transistor LT is the n-channel MISFET by way of example in the description below, the peripheral transistor LT may be a p-channel MISFET.

<Element Structure of Pixel Region and Peripheral Circuit Region>

Next, the structure of the semiconductor device according to the first embodiment will be described below with reference to the cross-sectional views (FIGS. 5 and 6) of the semiconductor device in the first embodiment. FIGS. 5 and 6 are cross-sectional views of the semiconductor device in the first embodiment. FIG. 5 substantially corresponds to a cross-sectional view taken along the line A-A of FIG. 3, and FIG. 6 substantially corresponds to a cross-sectional view taken along the line B-B of FIG. 4.

Figure 5:
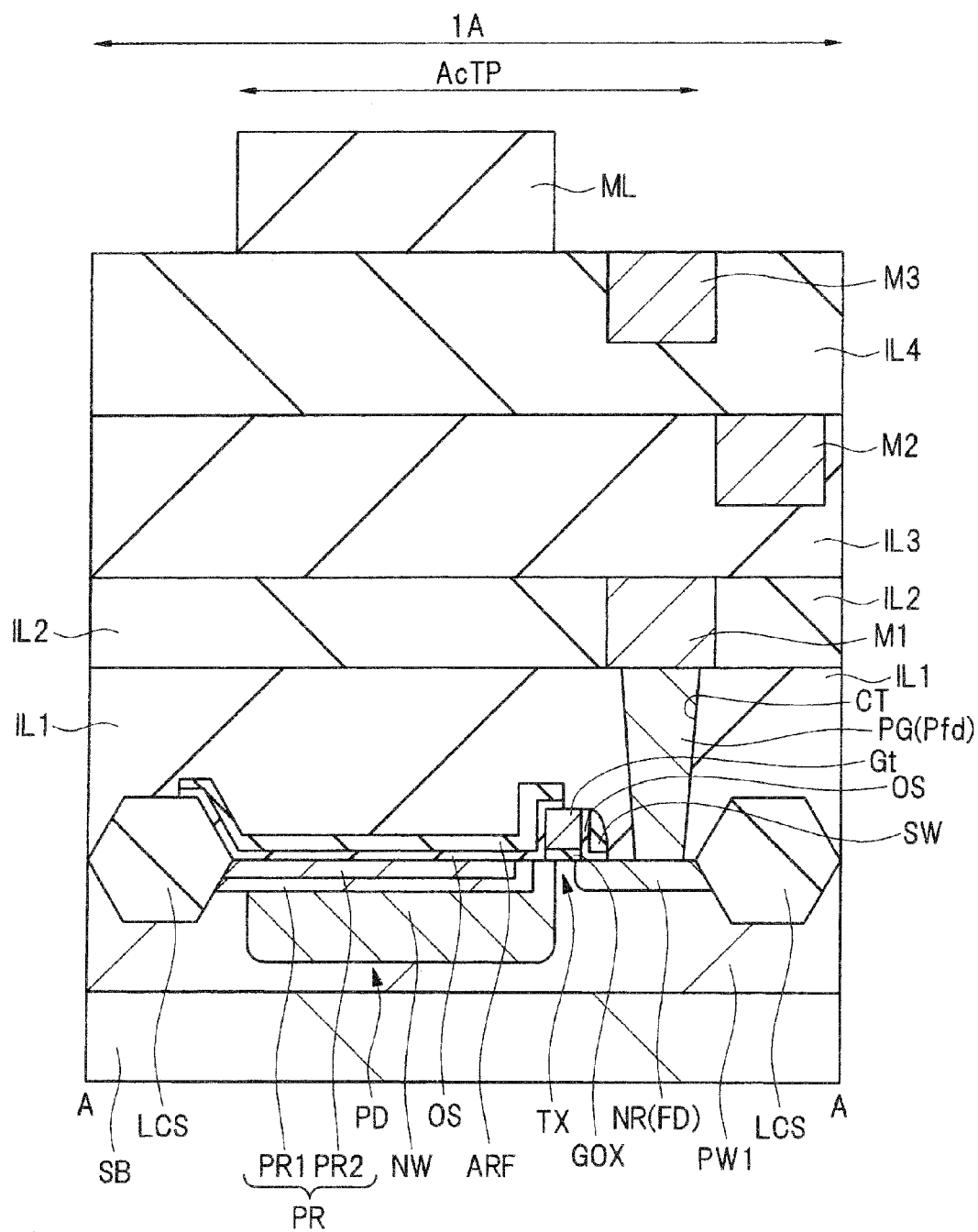
FIG. 5 is a cross-sectional view taken along the line A-A of FIG. 3.
Figure 6:
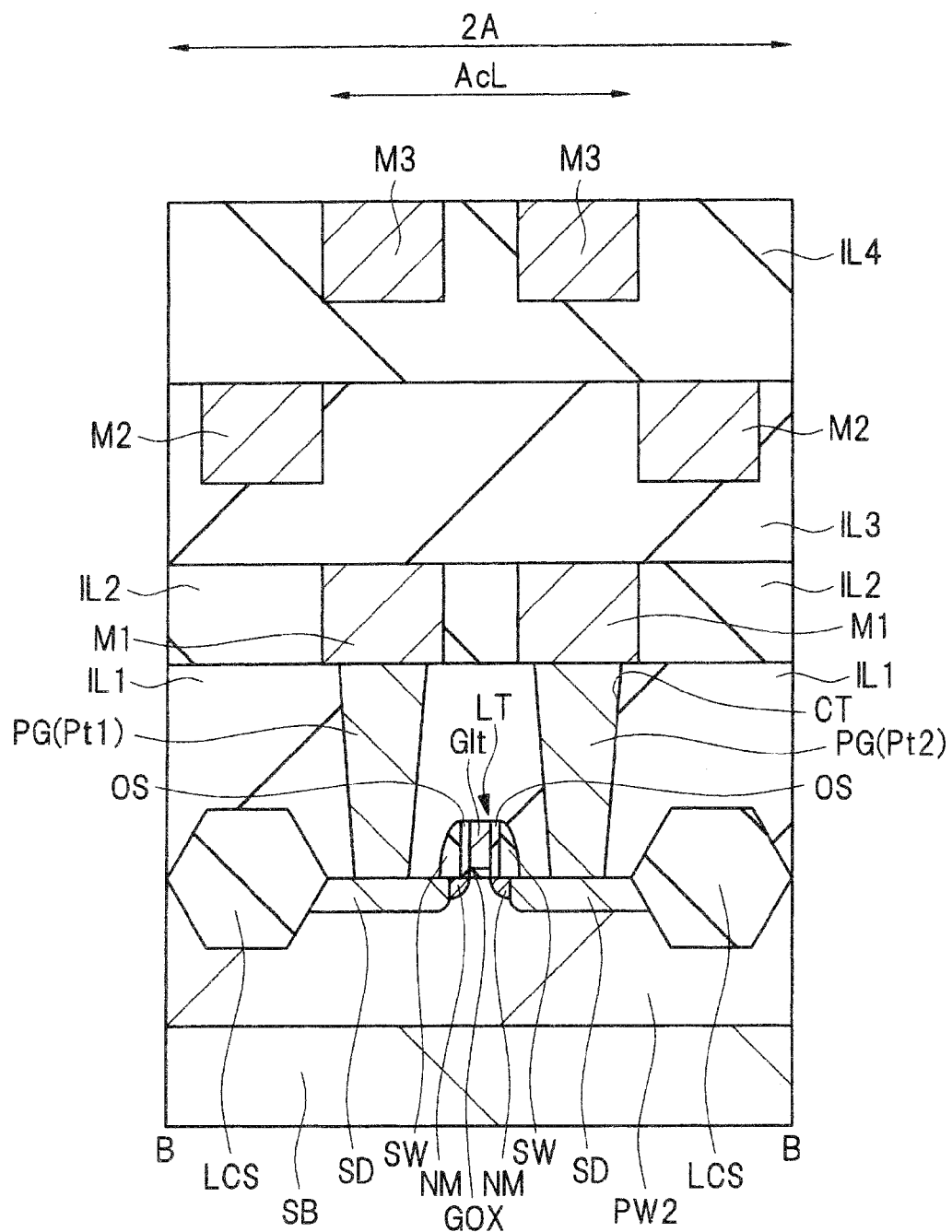
FIG. 6 is a cross-sectional view taken along the line B-B of FIG. 4.

As shown in FIG. 5, the photodiode PD and the transfer transistor TX are formed in the active region AcTP within the pixel region 1A of the semiconductor substrate SB. The photodiode PD is included of a p-type well PW1, an n-type semiconductor region (n-type well) NW, and a p-type semiconductor region PR which are formed in the semiconductor substrate SB. As shown in FIG. 6, the peripheral transistor LT is formed in the active region AcL within the peripheral circuit region 2A of the semiconductor substrate SB.

The semiconductor substrate SB is a semiconductor substrate (semiconductor wafer) including an n-type monocrystalline silicon or the like with n-type impurities (donors), such as phosphorus (P) or arsenic (As), introduced thereinto. In other embodiments, the semiconductor substrate SB can also be the so-called epitaxial wafer. In the case where the semiconductor substrate SB is the epitaxial wafer, for example, an epitaxial layer made of an n$^-$-type monocrystalline silicon with n-type impurities (e.g., phosphorus (P)) introduced thereinto is grown on the main surface of an n$^+$-type monocrystalline silicon substrate with n-type impurities (e.g., arsenic (As)) introduced thereinto, thereby enabling formation of the semiconductor substrate SB.

An element isolation region LCS made of an insulator is arranged at the outer periphery of the active region AcTP. In this way, exposed regions of the semiconductor substrate SB surrounded by the element isolation region LCS become active regions, including the active region AcTP and the active region AcL.

P-type wells (p-type semiconductor regions) PW1 and PW2 are formed from the main surface of the semiconductor substrate SB at respective predetermined depths. The p-type well PW1 is formed across the entire active region AcTP. That is, the p-type well PW1 is formed across a region with the photodiode PD formed therein, and a region with the transfer transistor TX formed therein. The p-type well PW2 is formed across the entire active region AcL. That is, the p-type well PW2 is formed in a region with the peripheral transistor LT formed therein. Each of the p-type well PW1 and the p-type well PW2 is a p-type semiconductor region with p-type impurities, such as boron (B), introduced thereinto. The p-type well PW1 and the p-type well PW2 are regions independent from each other, and are also electrically independent.

As shown in FIG. 5, the n-type semiconductor region (n-type well) NW is formed in the semiconductor substrate SB within the active region AcTP so as to be enclosed by the p-type well PW1. The n-type semiconductor region NW is an n-type semiconductor region with n-type impurities, such as phosphorus (P) or arsenic (As), introduced thereinto.

The n-type semiconductor region NW is an n-type semiconductor region for forming the photodiode PD, but also serves as a source region of the transfer transistor TX. That is, the n-type semiconductor region NW is mainly formed in a region with the photodiode PD formed therein. However, a part of the n-type semiconductor region NW is formed so as to planarly overlap with (in the planar view) the gate electrode Gt of the transfer transistor TX. The depth of the n-type semiconductor region NW (bottom surface thereof) is formed to be shallower than that of the p-type well PW1 (bottom surface thereof).

The p-type semiconductor region PR is formed in a part of the surface of the n-type semiconductor region NW. The p-type semiconductor region PR is a p-type semiconductor region into which p-type impurities, such as boron (B), are introduced (doped) at a high concentration. The concentration of impurities in the p-type semiconductor region PR (p-type impurity concentration) is higher than that of the p-type well PW1 (p-type impurity concentration). Thus, the conductivity (electric conductivity) of the p-type semiconductor region PR is higher than the conductivity (electric conductivity) of the p-type well PW1.

The depth of the p-type semiconductor region PR (bottom surface thereof) is shallower than that of the n-type semiconductor region NW (bottom surface thereof). The p-type semiconductor region PR is mainly formed over the surface layer part (surface part) of the n-type semiconductor region NW. Thus, as viewed in the thickness direction of the semiconductor substrate SB, the n-type semiconductor region NW exists under the p-type semiconductor region PR as the uppermost layer, and the p-type well PW1 exists under the n-type semiconductor region NW.

A part of the p-type semiconductor region PR in a region where the n-type semiconductor region NW is not formed is in contact with the p-type well PW1. That is, the n-type semiconductor region NW exists directly under the p-type semiconductor region PR, and the p-type semiconductor region PR includes a part in contact with the n-type semiconductor region NW, and a part directly under which the p-type well PW1 exists and coming into contact with the p-type well PW1.

PN junction is formed between the p-type well PW1 and the n-type semiconductor region NW. Further, PN junction is formed between the p-type semiconductor region PR and the n-type semiconductor region NW. The photodiode (PN junction diode) PD is formed by the p-type well PW1 (p-type semiconductor region), the n-type semiconductor region NW, and the p-type semiconductor region PR. The photodiode PD is a light receiving element serving as a photoelectric conversion element. The photodiode PD has a function of generating charges by photoelectrically converting input light, and storing therein the generated charges. The n-type semiconductor region NW stores therein the charges photoelectrically converted by the photodiode PD, and thus the n-type semiconductor region NW can be called the charge storage layer of the photodiode PD. The p-type semiconductor region PR is formed on the main surface side of the semiconductor substrate SB, and thus can be called the "surface layer".

The surface layer (p-type semiconductor region PR) is formed for the purpose of suppressing the generation of electrons based on numerous interface states formed at the surface of the semiconductor substrate SB. That is, electrons are often generated at the surface region of the semiconductor substrate SB due to the influence of the interface states even when no light is applied, inducing an increase in dark current. Thus, a surface layer made of the p-type semiconductor region PR with holes serving as a majority carrier is formed over the surface of the n-type semiconductor region NW with electrons serving as a majority carrier, which can suppress the generation of electrons without irradiation with light, thus reducing an increase in dark current. Thus, the surface layer serves to recombine electrons boosting from the outermost surface of the photodiode with holes in the p-type semiconductor region, thereby reducing the dark current or white defects upon the dark current.

In the semiconductor device of the first embodiment, the surface layer is included of a sub-region PR1 serving as a p-type semiconductor region, and a sub-region PR2 serving as a p-type semiconductor region. The concentration of impurities in the sub-region PR2 is higher than that in the sub-region PR1. The bottom surface of the sub-region PR1 is formed more deeply in the depth direction of the semiconductor substrate SB than the bottom surface of the sub-region PR2, so that the sub-region PR1 is in contact with the charge storage layer (n-type semiconductor region NW) which is an n-type semiconductor region. The sub-region PR1 is arranged closer to the gate electrode Gt to be described later or the floating diffusion FD rather than the sub-region PR2, in the direction along the main surface of the semiconductor substrate SB.

The transfer transistor TX serves as a switch when transferring charges generated and stored in the photodiode PD, from the photodiode PD.

The gate electrode Gt is formed to overlap with a part of the n-type semiconductor region NW in the planar manner. The gate electrode Gt is a gate electrode of the transfer transistor TX, and is formed (arranged) over the semiconductor substrate SB via a gate insulating film GOX. A sidewall spacer SW is formed as a sidewall insulating film on the sidewall of the gate electrode Gt on a side of the floating diffusion FD of the transfer transistor TX via an offset spacer OS.

At the semiconductor substrate SB (p-type well PW1) in the active region AcTP, the n-type semiconductor region NW is formed on one of both sides of the gate electrode Gt, and an n-type semiconductor region NR is formed on the other. The n-type semiconductor region NR is an $n^+$-type semiconductor region into which n-type impurities, such as phosphorus (P) or arsenic (As), are introduced (doped), and formed in the p-type well PW1. The n-type semiconductor region NR is a semiconductor region serving as the floating diffusion (floating diffusion layer) FD, and also serves as a drain region of the transfer transistor TX.

The n-type semiconductor region NW is a charge storage layer for the photodiode PD, and can function as a semiconductor region for a source of the transfer transistor TX. That is, the source region of the transfer transistor TX is formed by the n-type semiconductor region NW. Thus, the n-type semiconductor region NW and the gate electrode Gt have a positional relationship that a part (on a source side) of the gate electrode Gt overlaps with a part of the n-type semiconductor region NW in the planar manner (in the planer view). The n-type semiconductor region NW and the n-type semiconductor region NR are formed to be spaced apart from each other with a channel formation region (corresponding to a substrate region directly under the gate electrode Gt) of the transfer transistor TX sandwiched therebetween.

The offset spacer OS, such as a silicon nitride film or a silicon oxide film, is formed over the surface of the photodiode PD (see FIG. 5), that is, over the surface layer. The offset spacer OS is formed to keep the surface properties of the semiconductor substrate SB, that is, interface properties adequate. An antireflection film ARF made of a silicon oxide film is formed over the offset spacer OS. That is, the antireflection film ARF is formed over the n-type semiconductor region NW and the surface layer via the offset spacer OS. Parts (ends) of the antireflection film ARF and the offset spacer OS runs over the gate electrode Gt.

On the other hand, as shown in FIG. 6, the gate electrode Glt of the peripheral transistor LT is formed over the p-type well PW2 in the active region AcL via the gate insulating film GOX. Sidewall spacers SW are formed over the sidewalls on both sides of the gate electrode Glt via the offset spacers OS. Source and drain regions of the peripheral transistor LT are formed in the p-type well PW2 located on both sides of the gate electrode Glt. The source and drain regions of the peripheral transistor LT have a lightly doped drain (LDD) structure, which includes an $n^-$-type semiconductor region NM which is an n-type low-concentration semiconductor region, and an $n^+$-type semiconductor region SD which is an n-type high-concentration semiconductor region. A metal silicide layer may be formed over the gate electrode Glt in the peripheral transistor LT, and the surface of the $n^+$-type semiconductor region SD configuring the source and drain regions.

As shown in FIGS. 5 and 6, an interlayer insulating film IL1 is formed over the semiconductor substrate SB to cover the gate electrode Gt, the antireflection film ARF, and the gate electrode Glt. The interlayer insulating film IL1 is formed over the entire main surface of the semiconductor substrate SB including the pixel region 1A and the peripheral circuit region 2A. The interlayer insulating film IL1 is formed of a silicon oxide film, for example, using tetra ethyl ortho silicate (TEOS) as a raw material. Conductive plugs PG, including plugs Pfd, Ptg, Pt1, and Pt2, are embedded in the interlayer insulating film IL1. For example, as shown in FIG. 5, the plug Pfd is formed as the plug PG over the n-type semiconductor region NR as the floating diffusion FD. The plug Pfd reaches the n-type semiconductor region NR through the interlayer insulating film IL1 to be electrically coupled to the n-type semiconductor region NR.

The conductive plugs PG, including the plugs Pfd, Ptg, Pt1, and Pt2, are formed, for example, by embedding a barrier conductive film and a tungsten film formed over the barrier conductive film, in respective contact holes formed in the interlayer insulating film IL1. The barrier conductive film is included of, for example, a laminated film (that is, a titanium/titanium nitride film) including a titanium film and a titanium nitride film formed over the titanium film.

For example, an interlayer insulating film IL2 is formed over the interlayer insulating film IL1 with the plugs PG (Pfd, Ptg, Pt1, Pt2) embedded, and a wiring M1 is formed in the interlayer insulating film IL2.

The interlayer insulating film IL2 is formed of, for example, a silicon oxide film, but is not limited thereto. The interlayer insulating film IL2 can also be formed of a low-dielectric-constant film having a lower dielectric constant than that of the silicon oxide film. Suitable low-dielectric-constant films can include, for example, a SiOC film.

The wiring M1 is formed of, for example, a copper wiring, by using a damascene method. Note that the wiring M1 is not limited to a copper wiring, and can also be formed of an aluminum wiring. When the wiring M1 is an embedded copper wiring (damascene copper wiring) (note that FIGS. 5 and 6 correspond to this case), the embedded copper wiring is embedded in a wiring trench formed in the interlayer insulating film IL1. When the wiring M1 is an aluminum wiring, the aluminum wiring is formed by patterning the conductive film formed over the interlayer insulating film.

An interlayer insulating film IL3 is formed of, for example, a silicon oxide film or a low-dielectric film, over the interlayer insulating film IL2 with the wiring M1 formed therein. A wiring M2 is formed in the interlayer insulating film IL3. An interlayer insulating film IL4 is formed over the interlayer insulating film IL3 with the wiring M2 formed therein. A wiring M3 is formed in the interlayer insulating film IL4. The wirings M1 to M3 form a wiring layer. The wirings M1 to M3 are formed not to planarly overlap with the photodiode. This is because the light entering the photodiode is not interrupted by the wirings M1 to M3.

Further, a microlens ML is mounted over the interlayer insulating film IL4 with the wiring M3 formed therein. Note that a color filter may be provided between the microlens ML and the interlayer insulating film IL4.

Referring to FIG. 5, once the light is applied to the pixel PU (see FIG. 1), first, an incident light passes through the microlens ML. Thereafter, the light passes through the interlayer insulating films IL4 to IL1 that are transparent for the visible light, and then enters the antireflection film ARF. The antireflection film ARF suppresses the reflection of the incident light, thereby allowing the incident light of sufficient quantity to enter the photodiode PD. Since in the photodiode PD, the energy of the incident light is larger than a band gap of silicon, the incident light is absorbed and converted by the photoelectric conversion, producing hole-electron pairs. The electrons produced at this time are stored in the n-type semiconductor region NW. At appropriate timing, the transfer transistor TX is turned on. Specifically, a voltage equal to or higher than a threshold voltage is applied to the gate electrode Gt of the transfer transistor TX. Then, a channel region is formed in a channel formation region directly under the gate insulating film GOX of the transfer transistor TX, so that the n-type semiconductor region NW serving as a source region of the transfer transistor TX is electrically conducted to the n-type semiconductor region NR serving as a drain region of the transfer transistor TX. As a result, the electrons stored in the n-type semiconductor region NW reach the drain region (n-type semiconductor region NR) through the channel region, and are derived from the drain region (n-type semiconductor region NR) to an external circuit through the plug Pfd and the wiring layer.

<Manufacturing Method of Semiconductor Device>

Next, a manufacturing method of the semiconductor device in the first embodiment will be described below with reference to FIGS. 5 to 24. For simplification of the drawings, manufacturing steps following the step shown in FIGS. 23 and 24 will be described using FIGS. 5 and 6.

Figure 7:
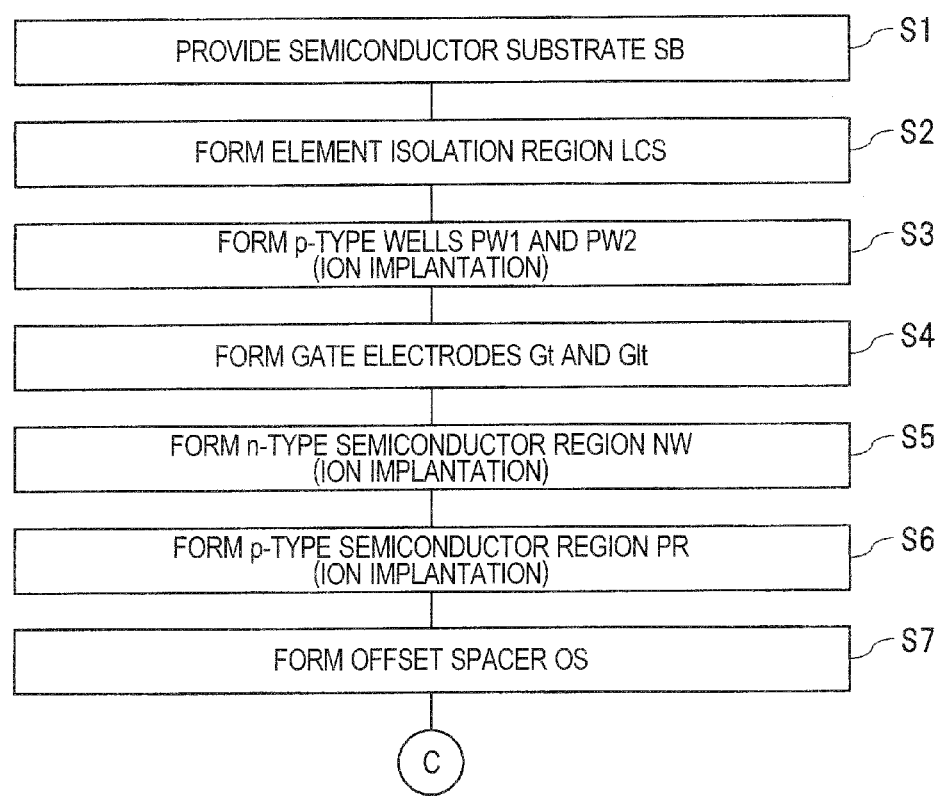
FIG. 7 is a flow chart showing a manufacturing procedure for the semiconductor device in the first embodiment.
Figure 8:
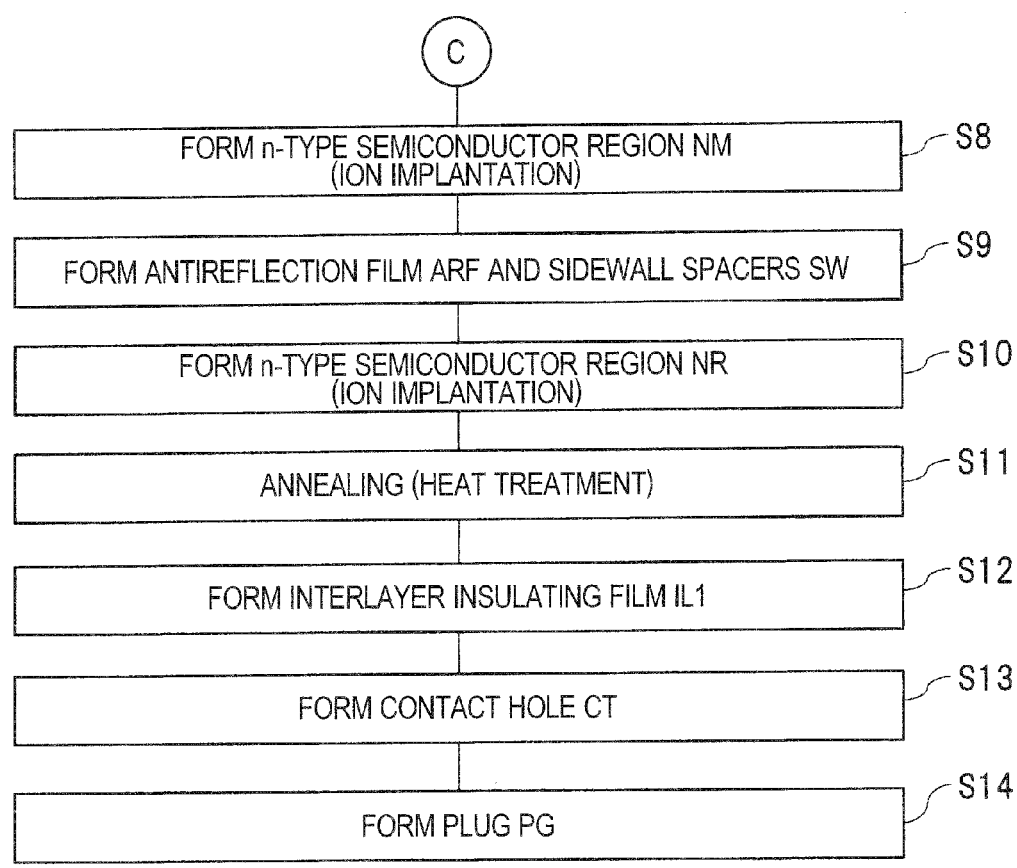
FIG. 8 is a flow chart showing another manufacturing procedure for the semiconductor device in the first embodiment.

FIGS. 7 and 8 are process flow charts showing a manufacturing procedure for the semiconductor device in the first embodiment. FIGS. 9 to 24, and FIGS. 5 and 6 are cross-sectional views of main parts in manufacturing steps of the semiconductor device in the first embodiment. Among FIGS. 9 to 24, FIGS. 9, 11, 13, 15, 17, 19, 21, and 23 are cross-sectional views corresponding to FIG. 5, that is, cross-sectional views taken along the line A-A of FIG. 3. Among FIGS. 7 to 24, FIGS. 10, 12, 14, 16, 18, 20, 22, and 24 are cross-sectional views corresponding to FIG. 6, that is, cross-sectional views taken along the line B-B of FIG. 4.

In manufacturing the semiconductor device of the first embodiment, first, as shown in step S1 of FIG. 7, a semiconductor substrate (semiconductor wafer) SB is provided (prepared).

The semiconductor substrate SB is a semiconductor substrate (semiconductor wafer) including an n-type monocrystalline silicon or the like with n-type impurities, such as phosphorus (P) or arsenic (As), introduced thereinto. In other embodiments, the semiconductor substrate SB can also be the so-called epitaxial wafer. When the semiconductor substrate SB is the epitaxial wafer, for example, an epitaxial layer made of an n⁻-type monocrystalline silicon with n-type impurities (e.g., phosphorus (P)) introduced thereinto is grown on the main surface of an n⁺-type monocrystalline silicon substrate with n-type impurities (e.g., arsenic (As)) introduced thereinto, thereby enabling formation of the semiconductor substrate SB.

Figure 9:
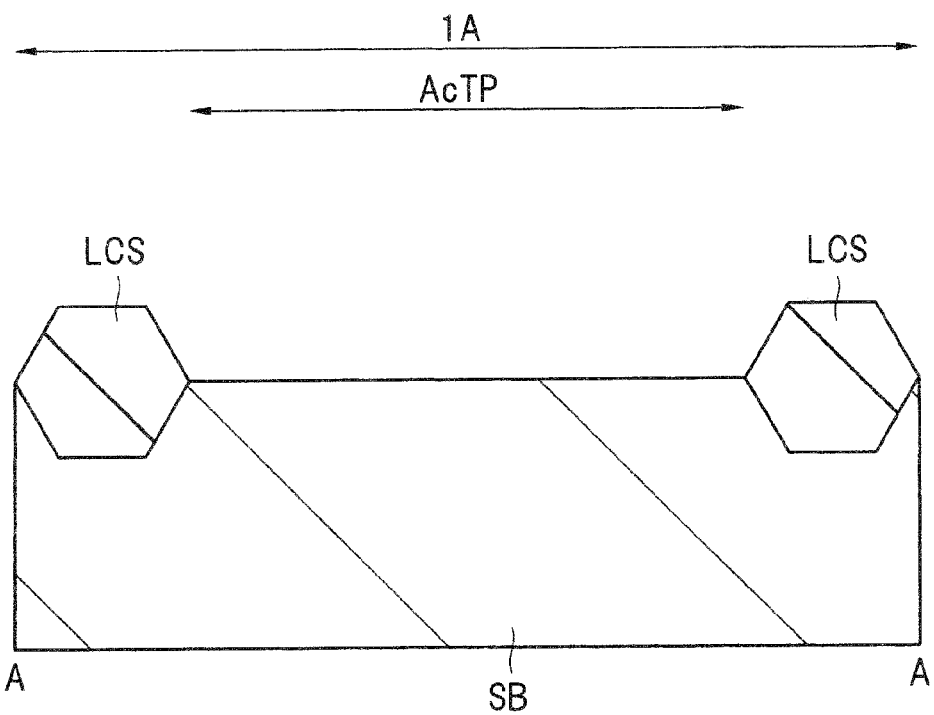
FIG. 9 is a cross-sectional view of a step of the manufacturing procedure for the semiconductor device in the first embodiment.
Figure 10:
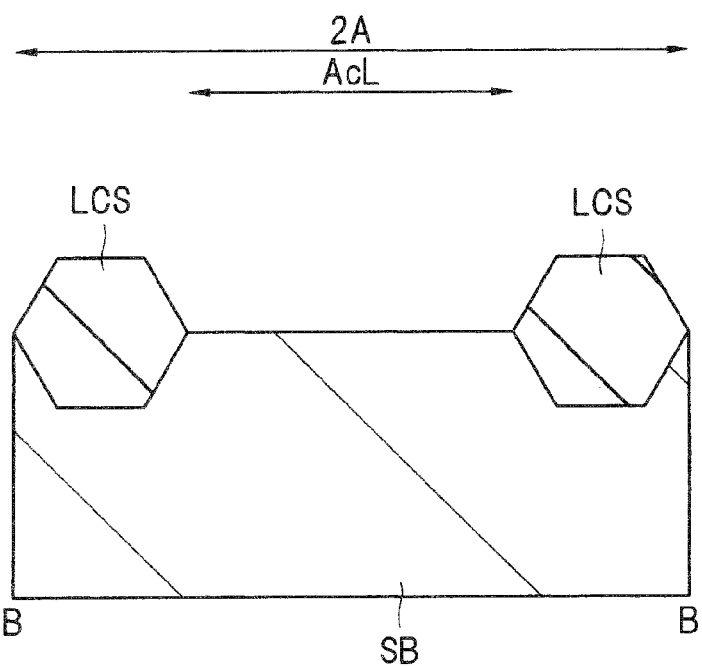
FIG. 10 is a cross-sectional view of the same step of the manufacturing procedure for the semiconductor device as that shown in FIG. 9.

Then, as illustrated in FIGS. 9 and 10, an element isolation region LCS is formed in the semiconductor substrate SB (in step S2 of FIG. 7).

The element isolation region LCS is formed of an insulating film, such as an oxide film. For example, regions of the semiconductor substrate SB to serve as the active regions, including the active regions AcTP and AcL, are covered with the silicon nitride film. In this state, the semiconductor substrate SB is subjected to thermal oxidation, so that the element isolation region LCS can be formed of a thermally-oxidized film, over the main surface of the semiconductor substrate SB in the region not covered with the silicon nitride film. Such formation of the element isolation region is called a local oxidation of silicon (LOCOS) method. The element isolation region LCS partitions (defines) the active regions, including the active region AcTP and the active region AcL.

The element isolation region LCS may be formed using a shallow trench isolation (STI) method, instead of the LOCOS method. In use of the STI method, the element isolation region LCS is formed of an insulating film (e.g., a silicon oxide film) embedded in a trench of the semiconductor substrate SB. For example, the regions of the semiconductor substrate SB serving as the active regions, including the active regions AcTP and AcL, are covered with the silicon nitride film. By etching the semiconductor substrate SB using the silicon nitride film as an etching mask, the trench for element isolation is formed in the semiconductor substrate SB, and then an insulating film, such as a silicon oxide film, is embedded in the trench for element isolation, so that the element isolation region LCS can be formed.

Note that the active region AcTP is formed in the pixel region 1A, and the active region AcL is formed in the peripheral circuit region 2A.

Figure 11:
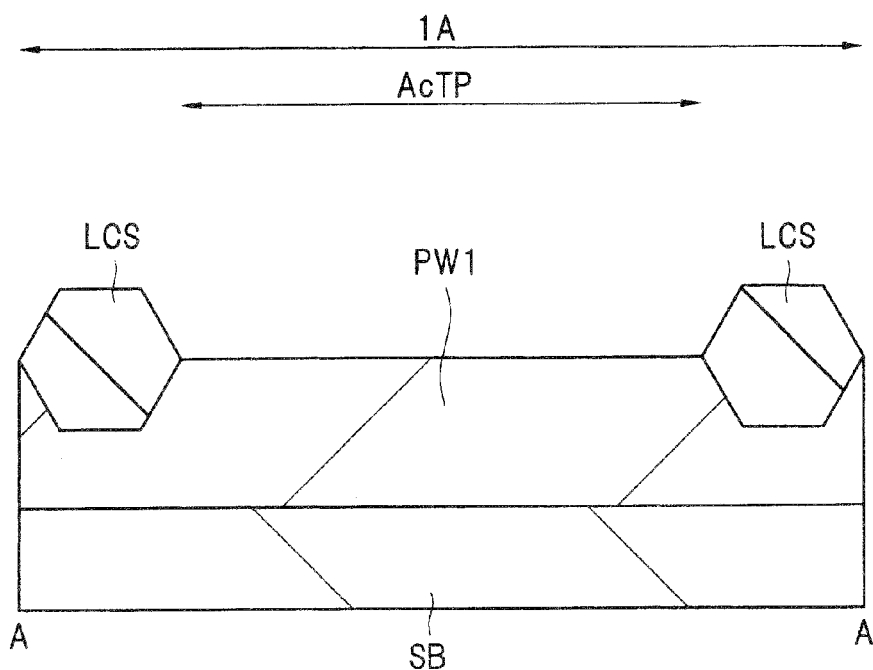
FIG. 11 is a cross-sectional view of another step of the manufacturing procedure for the semiconductor device, following the step shown in FIG. 9.
Figure 12:
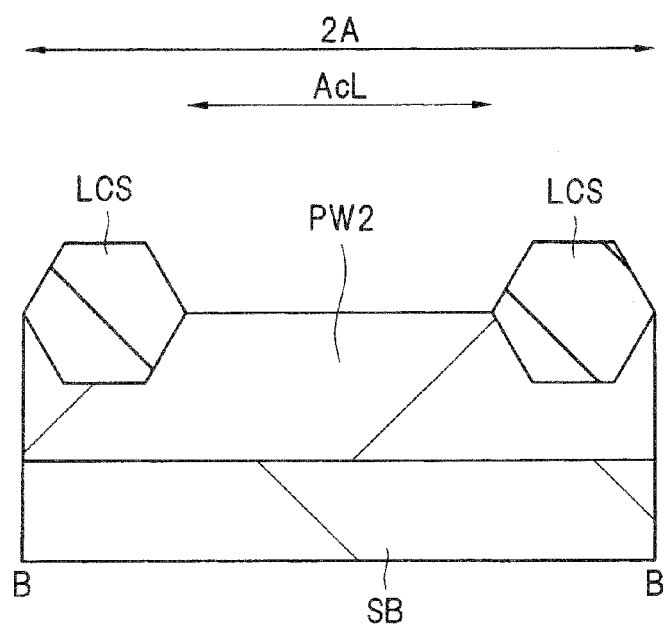
FIG. 12 is a cross-sectional view of the same step of the manufacturing procedure for the semiconductor device as that shown in FIG. 11.

Then, as respectively illustrated in FIGS. 11 and 12, the p-type well (p-type semiconductor region) PW1 is formed in the semiconductor substrate SB within the pixel region 1A, and the p-type well (p-type semiconductor region) PW2 is formed in the semiconductor substrate SB within the peripheral circuit region 2A (in step S3 of FIG. 7).

The p-type well PW1 serves as a p-type semiconductor region for formation of the photodiode PD, and also as a p-type well region for formation of the n-channel transfer transistor TX. The p-type well PW2 serves as a p-type well region for formation of the n-channel peripheral transistor LT.

The p-type wells PW1 and PW2 are formed at respective predetermined depths from the main surface of the semiconductor substrate SB. The p-type wells PW1 and PW2 can be formed by ion-implantation or the like of p-type impurities, such as boron (B), into the semiconductor substrate SB.

In the pixel region 1A, the p-type well PW1 is formed across a region with the photodiode PD formed therein, and a region with the transfer transistor TX formed therein. That is, the p-type well PW1 is formed across the entire active region AcTP in the pixel region 1A. The p-type well PW2 is formed in the peripheral circuit region 2A. The ion implantation for forming the p-type well PW1 and the ion implantation for forming the p-type well PW2 are performed in different ion implantation steps, or in the same ion implantation step.

The conduction type of the p-type wells PW1 and PW2 is a p type. The p type is an opposite conduction type to an n type, which is the conduction type of the semiconductor substrate SB. The p-type wells PW1 and PW2 are deeper than the element isolation region LCS with respect to the main surface of the semiconductor substrate SB as a reference.

Figure 13:
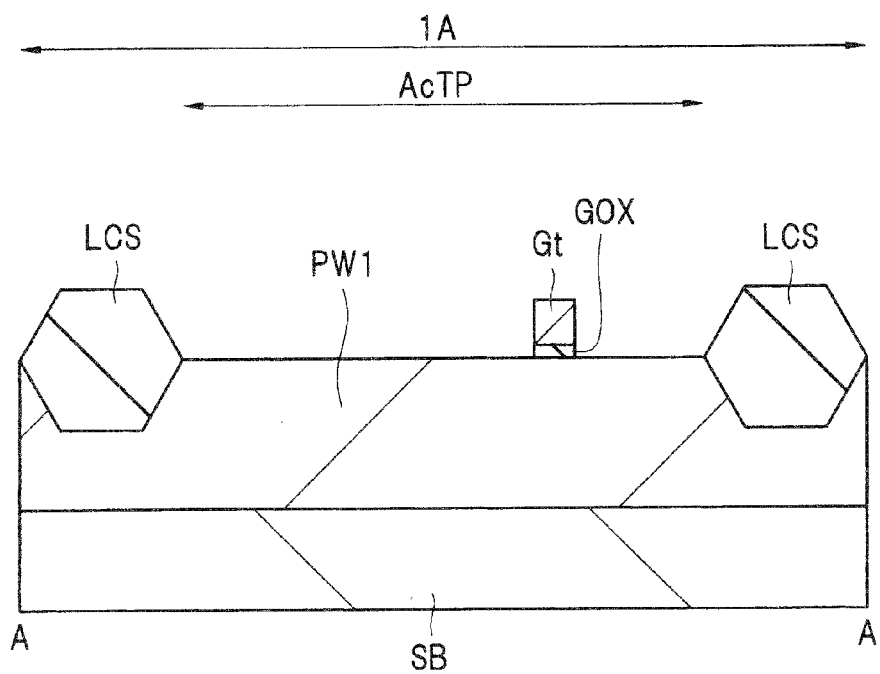
FIG. 13 is a cross-sectional view of another step of the manufacturing procedure for the semiconductor device, following the step shown in FIG. 11.
Figure 14:
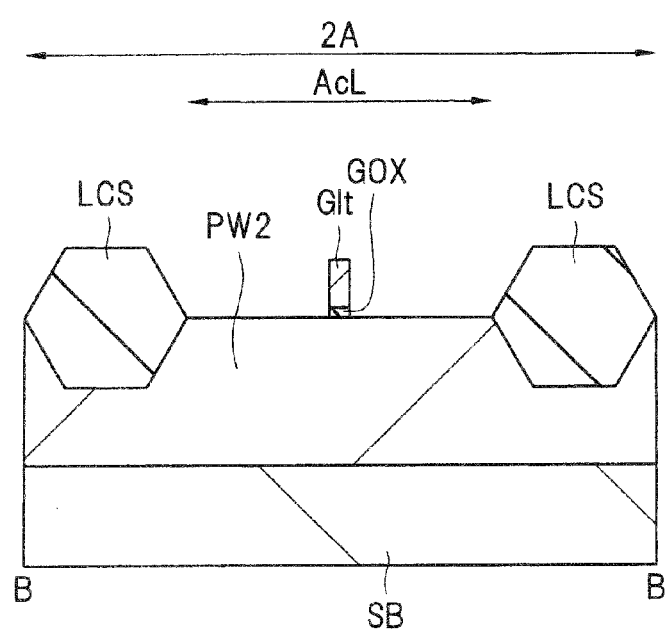
FIG. 14 is a cross-sectional view of the same step of the manufacturing procedure for the semiconductor device as that shown in FIG. 13.

Then, as illustrated in FIGS. 13 and 14, the gate electrodes Gt and Glt are formed (in step S4 of FIG. 7). In the pixel region 1A, the gate electrode Gt for the transfer transistor TX is formed over the semiconductor substrate SB (p-type well PW1) via the gate insulating film GOX, and in the peripheral circuit region 2A, the gate electrode Glt for the peripheral transistor LT is formed over the semiconductor substrate SB (p-type well PW2) via the gate insulating film GOX.

That is, after cleaning the main surface of the semiconductor substrate SB by a cleaning process, first, an insulating film for the gate insulating film GOX is formed over the main surface of the semiconductor substrate SB. The insulating film for the gate insulating film GOX is formed of, for example, a silicon oxide film, and can be formed using the thermal oxidation method and the like. In other embodiments, the insulating film used for the gate insulating film GOX can be a silicon oxynitride film, or a high-dielectric constant insulating film, such as a metal oxide film (e.g., a hafnium oxide film). Thereafter, a conductive film for the gate electrode (e.g., polycrystalline silicon film) is formed over the semiconductor substrate SB, that is, over the insulating film for the gate insulating film GOX, by a chemical vapor deposition (CVD) method or the like, followed by patterning of the conductive film for the gate electrode by photolithography and dry etching. In this way, the gate electrodes Gt and Glt included of the patterned conductive film (for example, polycrystalline silicon film) can be formed. The insulating film for the gate insulating film GOX remaining under each of the gate electrodes Gt and Glt is the gate insulating film GOX. In this embodiment, the insulating film for the gate insulating film GOX located in the regions not covered with the gate electrodes Gt and Glt is removed by dry etching for pattering the conductive film for the gate electrode, or by wet etching after the dry etching, by way of example. However, the insulating film GOX located in the regions not covered by the gate electrode Gt and Glt may not be removed at this stage, and be left for use as a protective film in ion implantation to be performed in a later step.

The gate electrode Gt serves as the gate electrode of the transfer transistor TX, and is formed over the semiconductor substrate SB (p-type well PW1) via the gate insulating film GOX in the pixel region 1A. The gate insulating film GOX under the gate electrode Gt serves as the gate insulating film of the transfer transistor TX. The gate electrode Glt serves as the gate electrode of the peripheral transistor LT, and is formed over the semiconductor substrate SB (p-type well PW2) via the gate insulating film GOX in the peripheral circuit region 2A. The gate insulating film GOX under the gate electrode Glt serves as the gate insulating film of the peripheral transistor LT.

Figure 15:
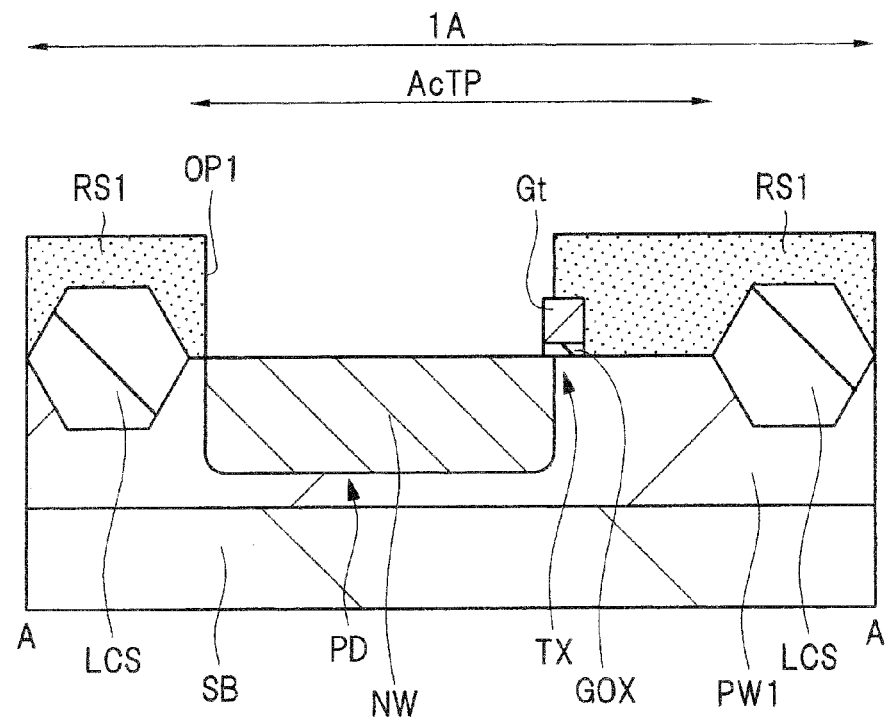
FIG. 15 is a cross-sectional view of another step of the manufacturing procedure for the semiconductor device, following the step shown in FIG. 13.
Figure 16:
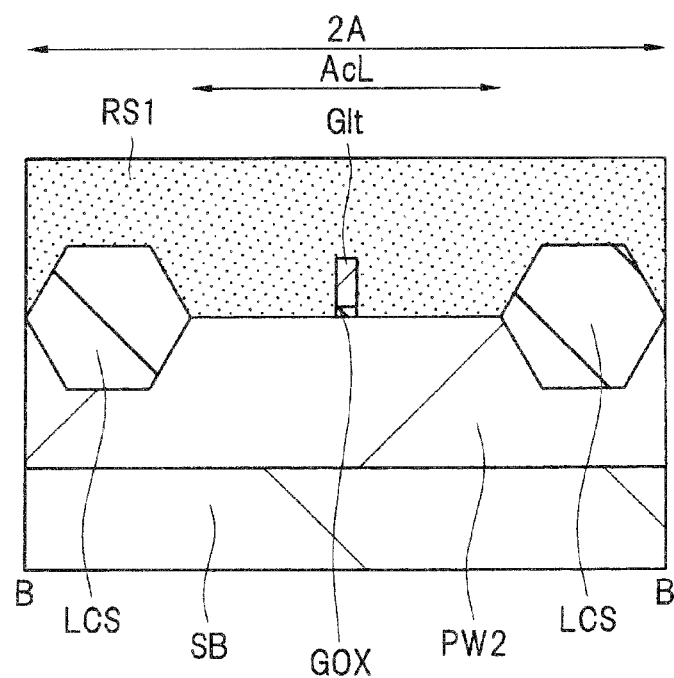
FIG. 16 is a cross-sectional view of the same step of the manufacturing procedure for the semiconductor device as that shown in FIG. 15.

Then, as illustrated in FIGS. 15 and 16, the n-type semiconductor region NW is formed (in step S5 of FIG. 7). The n-type semiconductor region NW is formed in the semiconductor substrate SB within the pixel region 1A. The n-type semiconductor region NW can be formed by ion-implanting n-type impurities, such as phosphorus (P) or arsenic (As), into the semiconductor substrate SB within the pixel region 1A.

The n-type semiconductor region NW is an n-type semiconductor region for forming the photodiode PD. The n-type semiconductor region NW is formed such that the depth of the n-type semiconductor region NW (the bottom surface thereof) is shallower than that of the p-type well PW1 (the bottom surface thereof), and that the n-type semiconductor region NW is enclosed by the p-type well PW1. Since the n-type semiconductor region NW is formed to be enclosed by the p-type well PW1, the bottom surface and side surfaces of the n-type semiconductor region NW are in contact with the p-type well PW1.

The n-type semiconductor region NW is not formed across the entire active region AcTP of the pixel region 1A, but formed only on one side (source side) of both regions of the gate electrode Gt in the semiconductor substrate SB within the active region AcTP without being formed on the other side (drain side).

Specifically, the n-type semiconductor region NW can be formed, for example, in the following way. That is, as shown in FIGS. 15 and 16, first, a photoresist pattern (photoresist layer) RS1 is formed as a resist layer over the semiconductor substrate SB by using the photolithography. The photoresist pattern RS1 has an opening OP1 that is opened (exposed) on one (source side) of both sides of the gate electrode Gt in the active region AcTP within the pixel region 1A, while the other (drain side) of both sides of the gate electrode Gt in the active region AcTP within the pixel region 1A is covered with the photoresist pattern RS1. Then, n-type impurity ions are implanted into the semiconductor substrate SB using the photoresist pattern RS1 as a mask (ion implantation interruption mask). Thus, in the pixel region 1A, the n-type impurities are ion-implanted into a part of the semiconductor substrate SB planarly overlapping with the opening OP1, whereby the n-type semiconductor region NW is formed in the semiconductor substrate SB within the active region AcTP of the pixel region 1A so as to be enclosed by the p-type well PW1. Thereafter, the photoresist pattern RS1 is removed.

Oblique ion implantation may be performed at an angle of inclination of, e.g., about 10° to 20° with respect to a normal line to the main surface of the semiconductor substrate SB in order to sufficiently ensure the amount of overlap between the gate electrode Gt and the n-type semiconductor region NW. The direction of the oblique ion implantation is a direction that is oriented from the source side of the transfer transistor TX to the channel formation region.

In the ion implantation step for forming the n-type semiconductor region NW, as shown in FIG. 16, the photoresist pattern RS1 is formed across the entire peripheral circuit region 2A. That is, in the entire peripheral circuit region 2A, the photoresist pattern RS1 is formed over the semiconductor substrate SB to cover the gate electrode Glt. Thus, in the ion implantation step for forming the n-type semiconductor region NW, ion implantation is not performed at the semiconductor substrate SB (p-type well PW2) in the peripheral circuit region 2A because the photoresist pattern RS1 functions therein as the mask (ion implantation interruption mask). In other words, in the ion implantation for forming the n-type semiconductor region NW, the semiconductor substrate SB in a region other than the region for formation of the n-type semiconductor region NW is covered with the photoresist pattern RS1, and n-type impurities are selectively ion-implanted in the region for formation of the n-type semiconductor region NW.

Figure 17:
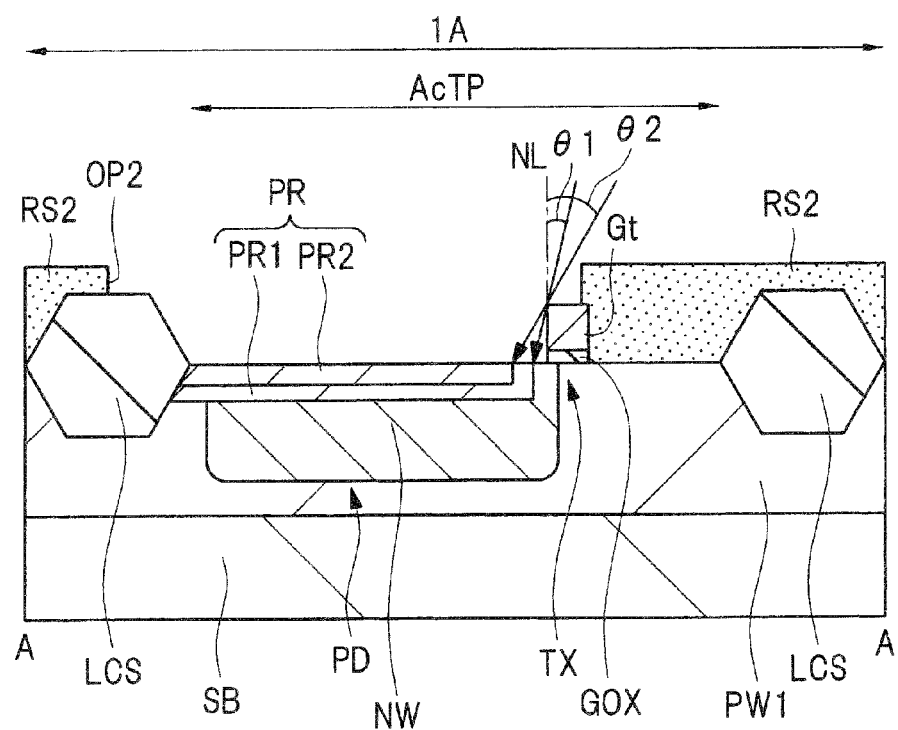
FIG. 17 is a cross-sectional view of another step of the manufacturing procedure for the semiconductor device, following the step shown in FIG. 15.
Figure 18:
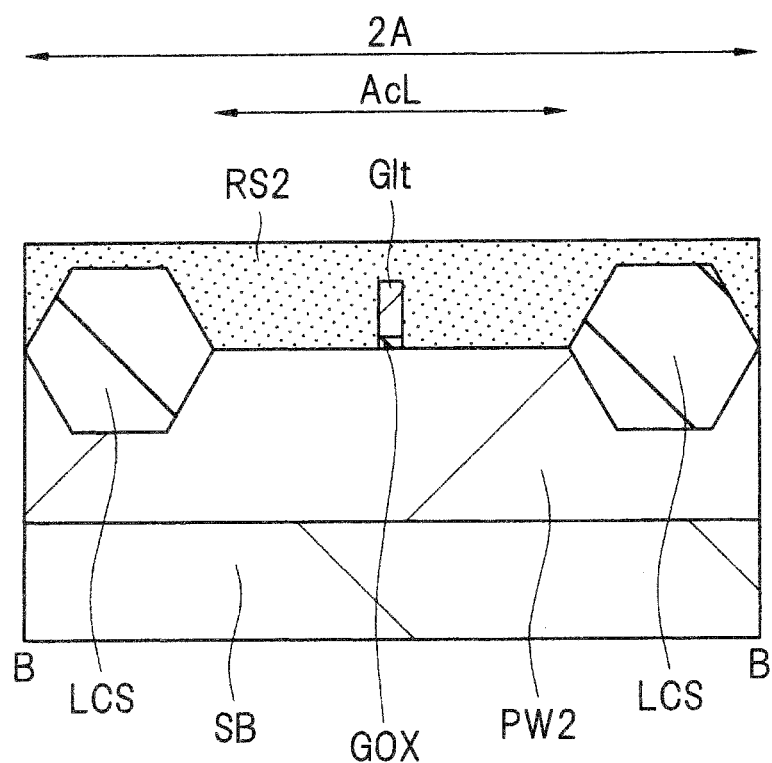
FIG. 18 is a cross-sectional view of the same step of the manufacturing procedure for the semiconductor device as that shown in FIG. 17.

Then, as illustrated in FIGS. 17 and 18, the p-type semiconductor region PR is formed (in step S6 of FIG. 7).

The p-type semiconductor region PR is formed by ion-implanting impurities, such as boron (B), into the semiconductor substrate SB. The p-type semiconductor region PR is included of the sub-region PR1 having a low impurity concentration, and the sub-region PR2 having a higher impurity concentration than that of the sub-region PR1.

The impurity concentration of the sub-region PR1 (p-type impurity concentration) is higher than that of the p-type well PW1 (p-type impurity concentration). The depth of the sub-region PR1 (the bottom surface thereof) is deeper than that of the sub-region PR2 (the bottom surface thereof), and shallower than that of the n-type semiconductor region NW (the bottom surface thereof). That is, the sub-region PR1 is in contact with the n-type semiconductor region NW. The p-type semiconductor region PR is mainly formed at the surface layer part (surface region) of the n-type semiconductor region NW. Thus, as viewed in the thickness direction of the semiconductor substrate SB, the n-type semiconductor region NW exists under the sub-regions PR2 and PR1 forming the p-type semiconductor region PR as the uppermost layer, and the p-type well PW1 exists under the n-type semiconductor region NW.

Specifically, the p-type semiconductor region PR can be formed, for example, in the following way. That is, as shown in FIGS. 17 and 18, first, a photoresist pattern (photoresist layer) RS2 is formed as a resist layer over the semiconductor substrate SB by the photolithography. The photoresist pattern RS2 has an opening OP2 that opens (exposes) a region for formation of the p-type semiconductor region PR in the active region AcTP of the pixel region 1A. As shown in FIG. 17, the photoresist pattern RS2 completely covers the region for formation of the floating diffusion FD, and partly covers the gate electrode Gt. One sidewall of the photoresist pattern RS2 configuring the opening OP2 is positioned above the gate electrode Gt, while the other sidewall is positioned above the element isolation region LCS. Then, impurities, such as boron (B), are ion-implanted into the semiconductor substrate SB using the photoresist pattern RS2 as the mask (ion implantation interruption mask). Thus, in the pixel region 1A, the p-type semiconductor region PR is formed over the surface layer part of the p-type well PW1 and the surface layer part of the n-type semiconductor region NW. Thereafter, the photoresist pattern RS2 is removed.

In the sub-region PR1, impurities, such as boron (B), are introduced into the semiconductor substrate SB by the oblique ion implantation at an inclination of an implantation angle θ1 (of 10° to) 20° with respect to the normal line NL to the main surface of the semiconductor substrate SB. At this time, the amount of implantation of impurities is, for example, $1 \times 10^{13}$ cm$^{-2}$, and an implantation energy is 5 keV. In the sub-region PR2, impurities, such as boron (B), are introduced into the semiconductor substrate SB by the oblique ion implantation at an inclination of an implantation angle θ2 (of 30°) with respect to the normal line NL to the main surface of the semiconductor substrate SB. Note that the oblique ion implantation is performed so as to offset the p-type semiconductor region PR from the gate electrode Gt, whereby the implantation angles θ1 and θ2 are set to create an inclination toward the drain side with respect to the normal line NL. In the ion implantation for forming the sub-region PR2, the amount of implantation of impurities is, for example, $2 \times 10^{13}$ cm$^{-2}$, and an implantation energy is 5 keV. In the oblique ion implantation of the sub-regions PR1 and PR2, since the photoresist pattern RS2 is apart from a shoulder part on the source side of the gate electrode Gt (left end, on the side where the photodiode PD is formed), whereby the positions of formation of the sub-regions PR1 and PR2 are determined by the shoulder portion on the source side of the gate electrode Gt. Note that either the sub-region PR1 or PR2 may be formed in advance.

Since the amount of implantation of the impurities into the sub-region PR2 is larger than that into the sub-region PR1, and the impurities for formation of the sub-region PR1 are also implanted into the sub-region PR2, the sub-region PR2 has a higher concentration than that of the sub-region PR1. In the depth direction of the semiconductor substrate SB, the sub-region PR1 is formed more deeply than the sub-region PR2, and the bottom surface of the sub-region PR1 is positioned more deeply than the bottom surface of the sub-region PR2 (positioned on the lower side), which brings the sub-region PR1 into contact with the n-type semiconductor region NW.

The sub-region PR1 is arranged closer to the gate electrode Gt (or floating diffusion) rather than the sub-region PR2. The end of the sub-region PR2 on the side of the gate electrode Gt is covered by the sub-region PR1, and the end of the sub-region PR1 on the side of the gate electrode Gt is covered by the n-type semiconductor region NW.

In the ion implantation step for forming the p-type semiconductor region PR, as shown in FIG. 18, the photoresist pattern RS2 is formed across the entire peripheral circuit region 2A. That is, in the entire peripheral circuit region 2A, the photoresist pattern RS2 is formed over the semiconductor substrate SB to cover the active region AcL. Thus, in the ion implantation step for formation of the p-type semiconductor region PR, no ion implantation is performed in the semiconductor substrate SB (p-type well PW2) in the peripheral circuit region 2A.

A part of the p-type semiconductor region PR in a region where the n-type semiconductor region NW is formed is in contact with the p-type well PW1. That is, the p-type semiconductor region PR includes a part under which the n-type semiconductor region NW exists and which is in contact with the n-type semiconductor region NW, and a part under which the p-type well PW1 exists and which is in contact with the p-type well PW1.

The p-type well PW1 is a p-type semiconductor region for formation of the photodiode PD. The n-type semiconductor region NW is an n-type semiconductor region for formation of the photodiode PD. The p-type semiconductor region PR is a p-type semiconductor region for formation of the photodiode PD. The photodiode (PN junction diode) PD is formed by the p-type well PW1 (p-type semiconductor region), the n-type semiconductor region NW, and the p-type semiconductor region PR. The PN junction is formed between the p-type well PW1 and the n-type semiconductor region NW. Further, the PN junction is also formed between the p-type semiconductor region PR (sub-region PR1) and the n-type semiconductor region NW.

After forming the p-type semiconductor region PR by the ion implantation, an annealing process for recovering crystal defects (crystal defects mainly caused by the ion implantation), that is, a heat treatment is preferably performed. The annealing process can recover crystal defects in the n-type semiconductor region NW and the p-type semiconductor region PR.

The annealing process (heat treatment) can be performed, for example, by laser annealing, microwave annealing, rapid thermal anneal (RTA), furnace annealing, or a combination thereof. The temperature of the annealing process (heat treatment) performed after the ion implantation can be, for example, in a range of about 300 to 1200° C. Here, the laser annealing is annealing (heat treatment) performed by irradiation with laser, the microwave annealing is annealing (heat treatment) performed by irradiation with microwave, the RTA is short-time annealing performed using lamp heating or the like, and the furnace annealing is annealing (heat treatment) performed by heating in an annealing furnace.

Figure 19:
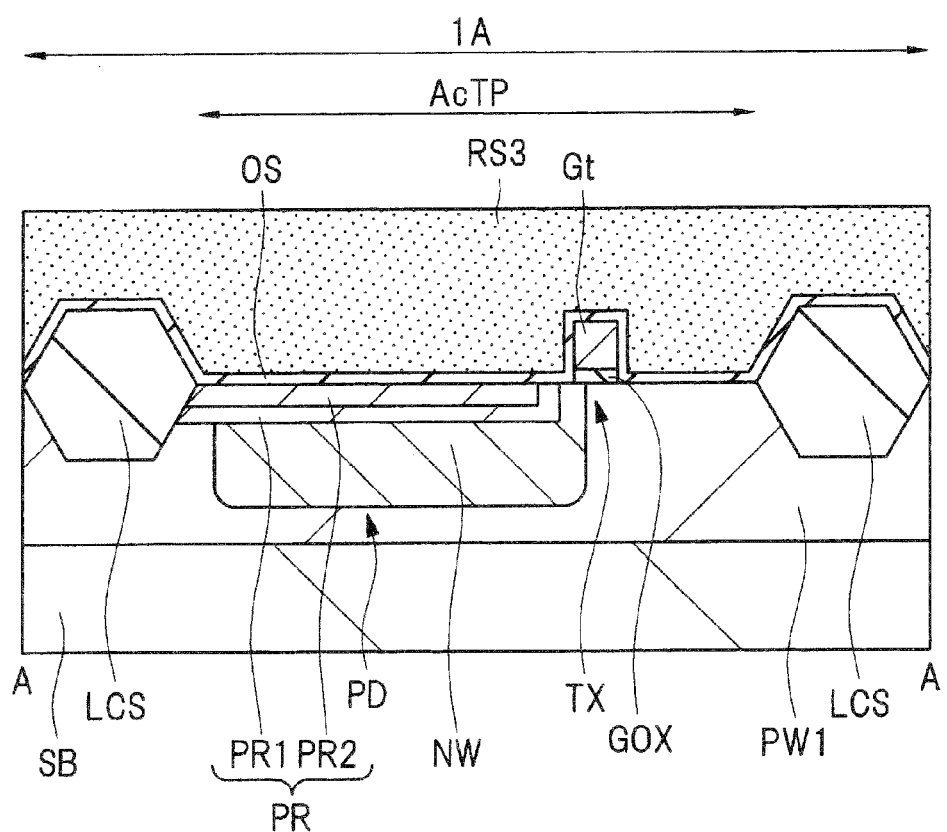
FIG. 19 is a cross-sectional view of another step of the manufacturing procedure for the semiconductor device, following the step shown in FIG. 17.
Figure 20:
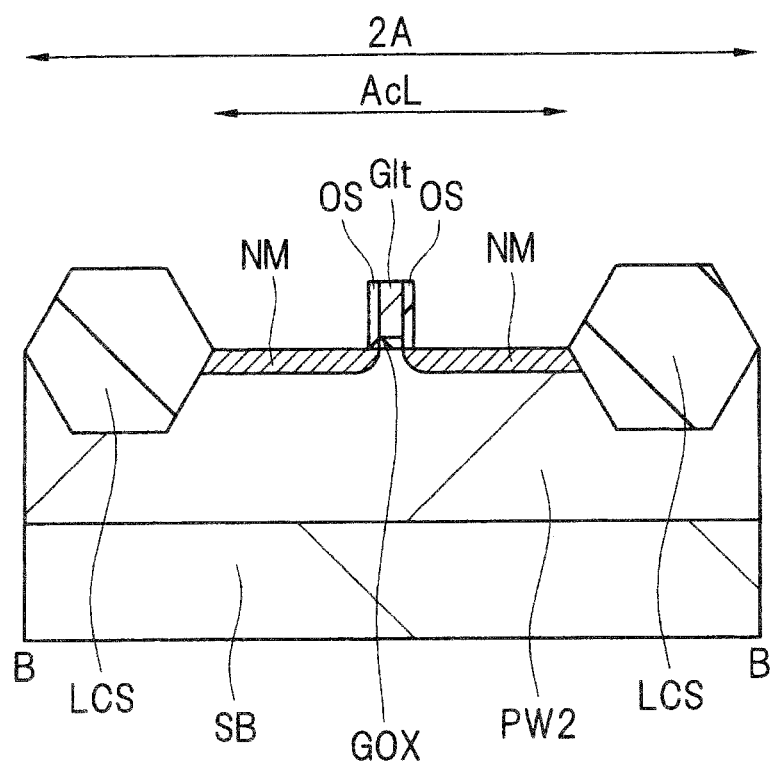
FIG. 20 is a cross-sectional view of the same step of the manufacturing procedure for the semiconductor device as that shown in FIG. 19.

Then, referring to FIGS. 19 and 20, the offset spacer OS and the n$^-$-type semiconductor region NM are formed (in step S7 of FIG. 7, and in step S8 of FIG. 8).

First, in the pixel region 1A and the peripheral circuit region 2A, the offset spacer OS is formed to cover the gate electrode Gt and the gate electrode Glt. The offset spacer OS is included of, for example, a silicon nitride film, or a silicon oxide film. Then, a photoresist pattern RS3 is formed to have a pattern that covers the pixel region 1A and exposes the peripheral circuit region 2A, and anisotropic dry etching is performed on the offset spacer OS. As a result, the offset spacer OS is selectively formed over each sidewall of the gate electrode Glt in the peripheral circuit region 2A.

Next, in the peripheral circuit region 2A, n⁻-type semiconductor regions (source and drain extension regions) NM are formed in the semiconductor substrate SB (p-type well PW2) on both sides of the gate electrode Glt.

The n⁻-type semiconductor regions NM are formed by ion-implanting n-type impurities, such as phosphorus (P) or arsenic (As), into the semiconductor substrate SB (p-type well PW2) within the peripheral circuit region 2A, using the photoresist pattern RS3 opened (exposed) at the peripheral circuit region 2A over the semiconductor substrate SB, as a mask (ion implantation interruption mask). At this time, in the peripheral circuit region 2A, the gate electrode Glt and the offset spacer OS function as the mask (ion implantation interruption mask), whereby the n⁻-type semiconductor regions NM are formed in self-alignment with the gate electrode Glt and the offset spacer OS. Thereafter, the photoresist pattern RS3 is removed.

Note that in the ion implantation step for forming the n⁻-type semiconductor region NM, as shown in FIG. 19, the photoresist pattern RS3 is formed over the semiconductor substrate SB including the surfaces of the gate electrode Gt in the pixel region 1A. That is, in the ion implantation step for formation of the n⁻-type semiconductor region NM, no ion implantation is performed in the pixel region 1A.

Figure 21:
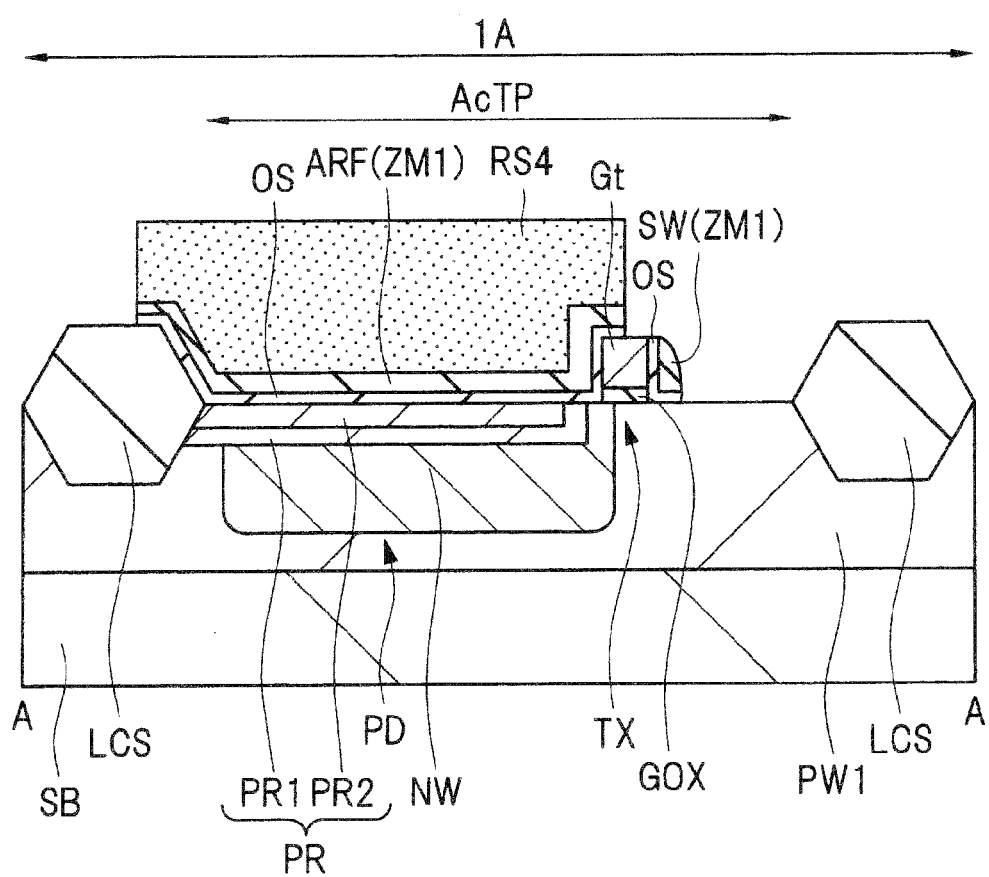
FIG. 21 is a cross-sectional view of another step of the manufacturing procedure for the semiconductor device, following the step shown in FIG. 19.
Figure 22:
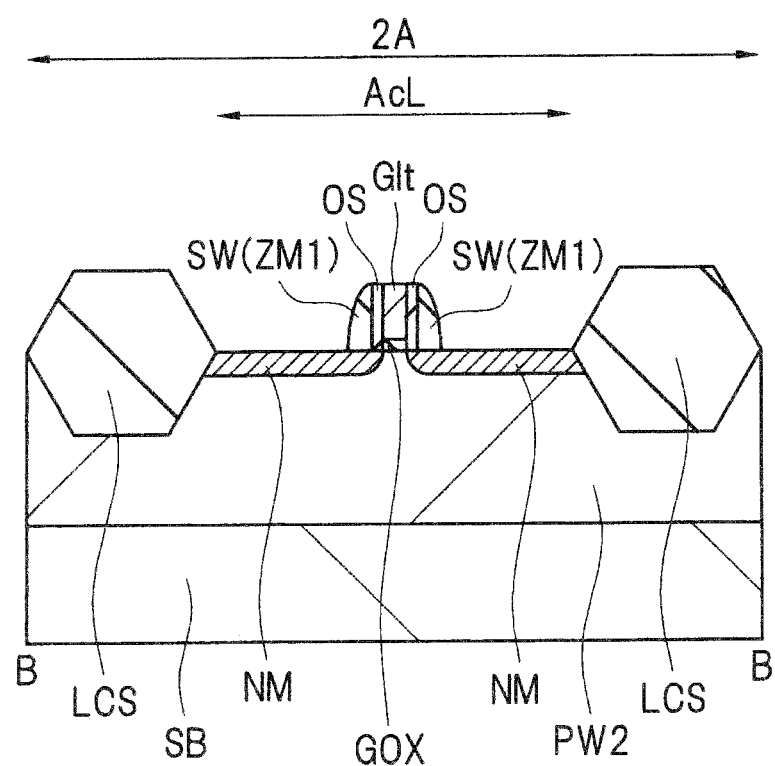
FIG. 22 is a cross-sectional view of the same step of the manufacturing procedure for the semiconductor device as that shown in FIG. 21.

Then, as shown in FIGS. 21 and 22, the antireflection film ARF and the sidewall spacer SW are formed over the semiconductor substrate SB in the pixel region 1A (in step S9 of FIG. 8).

The antireflection film ARF and the sidewall spacer SW can be formed, for example, in the following way. That is, first, an insulating film ZM1 is formed over the main surface of the semiconductor substrate SB to cover the gate electrodes Gt and Glt and the offset spacer OS. The insulating film ZM1 serves as both an insulating film for formation of the antireflection film ARF and an insulating film for formation of the sidewall spacer SW. Then, a photoresist pattern RS4 is formed over the insulating film ZM1 in a region for formation of the antireflection film ARF. The photoresist pattern RS4 completely covers the source side of the transfer transistor TX. That is, the photoresist pattern RS4 completely covers the n-type semiconductor region NW and the p-type semiconductor region PR provided on the source side of the transfer transistor TX. As shown in FIG. 21, one end of the photoresist pattern RS4 is positioned above the gate electrode Gt, while the other end is positioned above the element isolation region LCS. The photoresist pattern RS4 exposes the drain region, which is a part of the gate electrode Gt of the transfer transistor TX, and the peripheral circuit region 2A therefrom. Note that the insulating film ZM1 forming the antireflection film ARF can be made of, e.g., a silicon oxide film, a silicon nitride film, or a silicon oxynitride film, or a laminated film thereof. Although in this embodiment the offset spacers OS are left behind, the offset spacer OS may be removed from the insulating film ZM1.

The insulating film ZM1 is etched back by anisotropic dry-etching, such as reactive ion etching (RIE), using the photoresist pattern RS4 as a mask (etching mask). Thus, the insulating film ZM1 is locally left over the sidewalls of the gate electrodes Gt and Glt, thereby maintaining the insulating film ZM1 under the photoresist pattern RS4, while forming the sidewall spacers SW to thereby form the antireflection film ARF. The antireflection film ARF is formed over the n-type semiconductor region NW and the p-type semiconductor region PR via the offset spacer OS, and a part (end) of the antireflection film ARF runs over the gate electrode Gt.

The sidewall spacers SW are formed over both the sidewalls of the gate electrode Glt via the offset spacer OS. As to the gate electrode Gt, the sidewall spacer SW is formed over one sidewall on a drain side (on the side of the floating diffusion FD side) of both sidewalls of the gate electrode Gt via the offset spacer OS. On the other hand, the sidewall on the source side of the gate electrode Gt is covered with the antireflection film ARF via the offset spacer OS.

After the anisotropic dry-etching, the photoresist pattern RS4 is removed.

Figure 23:
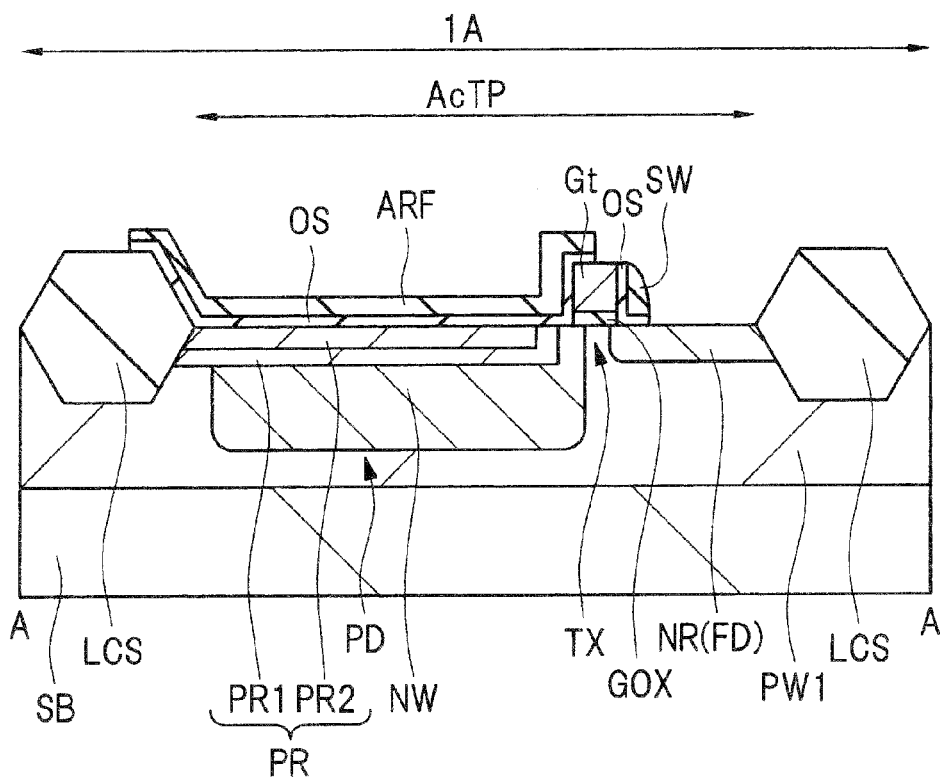
FIG. 23 is a cross-sectional view of another step of the manufacturing procedure for the semiconductor device, following the step shown in FIG. 21.
Figure 24:
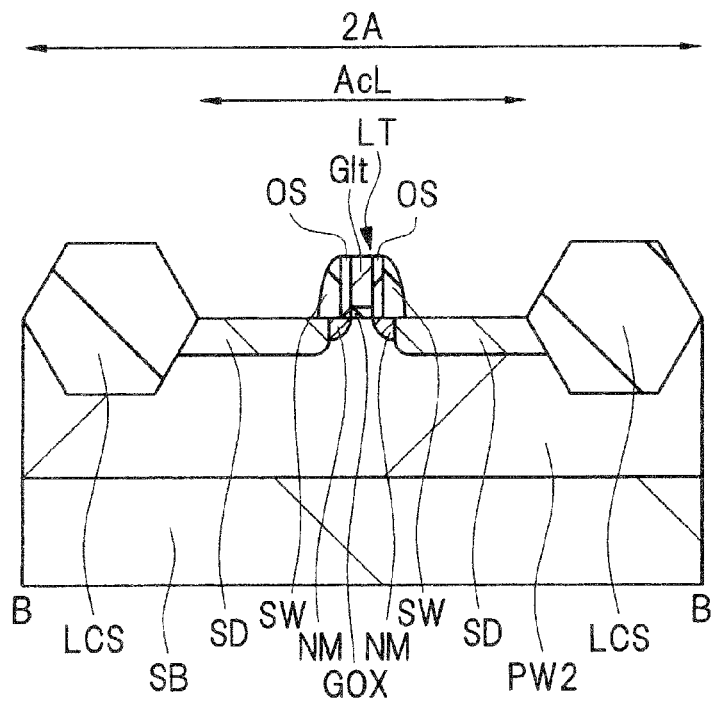
FIG. 24 is a cross-sectional view of the same step of the manufacturing procedure for the semiconductor device as that shown in FIG. 23.

Then, as illustrated in FIGS. 23 and 24, the n-type semiconductor region NW is formed (in step S10 of FIG. 8). In the active region AcTP of the pixel region 1A, impurities, such as phosphorus (P) or arsenic (As), are ion-implanted into the semiconductor substrate SB (p-type well PW1) on the other side (drain side) of both sides of the gate electrode Gt, thereby forming the n-type semiconductor region NR. Note that the drain side corresponds to the side opposite to the side with the n-type semiconductor region NW formed therein.

In the ion implantation step of forming the n-type semiconductor region NR, the antireflection film ARF and the gate electrode Gt serve as the mask (ion implantation interruption mask), thereby preventing impurities from being implanted into the region of the semiconductor substrate SB directly under the antireflection film ARF and the gate electrode Gt. Thus, as shown in FIG. 23, the n-type semiconductor region NR can be formed in the semiconductor substrate SB (p-type well PW1) on the other side of both sides of the gate electrode Gt of the transfer transistor TX (on the drain side, that is, on a side opposite to the side with the n-type semiconductor region NW formed therein).

The n-type semiconductor region NW and the n-type semiconductor region NR are formed to be spaced apart from each other with the channel formation region (corresponding to a substrate region directly under the gate electrode Gt) of the transfer transistor TX sandwiched therebetween. The n-type semiconductor region NR is an n-type high-concentration semiconductor region serving as the drain region of the transfer transistor TX. The n-type semiconductor region NR functions as the drain region of the transfer transistor TX, but can be defined as the floating diffusion (floating diffusion layer) FD.

In the peripheral circuit region 2A, n⁺-type semiconductor regions SD are formed by ion implantation into the semiconductor substrate SB (p-type well PW2) on both sides of a combined body included of the gate electrode Glt, offset spacer OS, and sidewall spacer SW. In the ion implantation for formation of the n⁺-type semiconductor region SD, the gate electrode Glt, the offset spacers OS over the sidewalls thereof, and the sidewall spacers SW can serve as a mask (ion implantation interruption mask). Thus, the n⁺-type semiconductor regions SD are formed in self-alignment with the gate electrode Glt, offset spacer OS, and sidewall spacer SW in the semiconductor substrate SB (p-type well PW2) within the peripheral circuit region 2A.

The n⁺-type semiconductor region SD is the same conduction type (here, n-type) of semiconductor region as the n⁻-type semiconductor region NM. The n⁺-type semiconductor region SD has a higher impurity concentration (n-type impurity concentration) and a greater depth (junction depth) than those of the n⁻-type semiconductor region NM. In this way, in the peripheral circuit region 2A, the semiconductor region (source and drain region) serving as the source or drain of the peripheral transistor LT is formed of the n⁺-type semiconductor region SD and the n⁻-type semiconductor region NM. Thus, the source and drain regions of the peripheral transistor LT each have the LDD structure.

Note that the n-type semiconductor region NR and the n⁺-type semiconductor region SD can be formed in the same ion implantation step, but can be formed in different ion implantation steps.

Then, an annealing process (heat treatment) is performed to activate the impurities already introduced by the ion implantation (in step S11 of FIG. 8).

Throughout the steps described above, the photodiode PD and the transfer transistor TX are formed in each pixel region 1A of the semiconductor substrate SB. The peripheral transistor LT is formed as the MISFET in the peripheral circuit region 2A of the semiconductor substrate SB.

The interlayer insulating films IL1 to IL4, the plugs PG, and the wirings M1 to M4 etc., will be described below with reference to the cross-sectional views of the completed state of FIGS. 5 and 6.

First, the interlayer insulating film IL1 and the plugs PG are formed over the main surface (entire main surface) of the semiconductor substrate SB (in steps S12 to S14 of FIG. 8). That is, the interlayer insulating film IL1 is formed over the semiconductor substrate SB to cover the gate electrodes Gt and Glt, sidewall spacers SW, and antireflection film ARF (in step S12 of FIG. 8). The interlayer insulating film IL1 can be formed, for example, by depositing a silicon oxide film over the semiconductor substrate SB by a CVD method using a tetra ethyl ortho silicate (TEOS) gas as a raw material gas.

After depositing the interlayer insulating film IL1, the surface (upper surface) of the interlayer insulating film IL1 is polished by a chemical mechanical polishing (CMP) method to planarize the upper surface of the interlayer insulating film IL1.

Then, the interlayer insulating film IL1 is dry-etched using a photoresist pattern (not shown) formed over the interlayer insulating film IL1 as an etching mask, thereby forming contact holes (through holes, vias, openings) CT in the interlayer insulating film IL1 (in step S13 of FIG. 8). Each contact hole CT is formed to penetrate the interlayer insulating film IL1. The contact holes CT are formed, for example, over the n-type semiconductor region NR, the n⁺-type semiconductor region SD, and the like. A part of the surface of the n-type semiconductor region NR is exposed from the bottom part of the contact hole CT formed over the n-type semiconductor region NR. A part of the surface of the n⁺-type semiconductor region SD is exposed from the bottom part of the contact hole CT formed over the n⁺-type semiconductor region SD.

Then, the conductive plug PG made of, e.g., tungsten (W), is formed as a conductor for coupling in each contact hole CT (in step S14 of FIG. 8). The plug PG can be formed, for example, in the following way.

In order to form the plug PG, first, a barrier conductive film is formed over the interlayer insulating film IL1 covering the inside (over the bottom surface and inner wall) of the contact hole CT. The barrier conductive film is included of, for example, a laminated film including a titanium film and a titanium nitride film formed over the titanium film (that is, a titanium/titanium nitride film), and can be formed using sputtering or the like. Then, a main conductive film made of a tungsten film etc., is formed over the barrier conductive film by the CVD method etc., to fill the contact hole CT. Thereafter, unnecessary parts of the main conductive film and barrier conductive film located outside the contact holes CT (over the interlayer insulating film IL1) are removed by a CMP method, an etching back method, or the like. In this way, the upper surface of the interlayer insulating film IL1 is exposed, and the plug PG is formed by the barrier conductive film and main conductive film maintained filling the contact holes CT of the interlayer insulating film IL1. For simplifying the drawing, FIGS. 5 and 6 illustrate the state in which the barrier conductive film and the main conductive film are integrated together to form the plug PG.

The plugs PG include plugs Pfd, Pt1, and Pt2. The plug Pfd among them is embedded in the contact hole CT formed over the n-type semiconductor region NR, passing through the interlayer insulating film IL1, and reaches the n-type semiconductor region NR, so that the plug Pfd is electrically coupled to the n-type semiconductor region NR. Each of the plugs Pt1 and Pt2 is embedded in the corresponding contact hole CT formed over the n⁺-type semiconductor region SD, and is electrically coupled to the n⁺-type semiconductor region SD.

Then, the interlayer insulating films IL2 to IL4 and the wirings M1 to M3 are formed over the interlayer insulating film IL1 with the plugs PG embedded therein.

For example, a laminated film included of a silicon nitride film and a silicon oxide film over the silicon nitride film is deposited by the CVD method or the like as the interlayer insulating film IL2 over the interlayer insulating film IL1. A wiring trench is formed in the laminated film using photolithography and dry-etching. Then, the barrier conductive film is formed over the interlayer insulating film IL2 covering the inside (over the bottom surface and inner wall) of the wiring trench. The barrier conductive film is included of a laminated film including, for example, a tantalum (Ta) film and a tantalum nitride (TaN) film over the tantalum film, and can be formed by sputtering or the like. Then, a thin copper film is deposited as a seed film over the barrier conductive film by sputtering or the like, and a copper plated film is deposited as the main conductive film over the seed film by electrolytic plating to fill the wiring trench with the copper plated film. Thereafter, unnecessary parts of the copper plated film, seed film, and barrier conductive film located outside the wiring trench (over the interlayer insulating film IL2) are removed by the CMP method, thereby forming the first wiring layer M1 using copper as a main conductive material in the wiring trench. Note that FIGS. 5 and 6 illustrate the state in which the copper plated film, seed layer, and barrier conductive film are integrated together to form the wiring M1. In this way, the barrier film, seed film, and copper plated film can be embedded in the wiring trench to form the wiring M1.

Further, likewise, the interlayer insulating film IL3 is formed over the interlayer insulating film IL2 with the wiring M1 formed therein, the wiring M2 is formed in the interlayer insulating film IL3, the interlayer insulating film IL4 is formed over the interlayer insulating film IL3 with the wiring M2 formed therein, and the wiring M3 is formed in the interlayer insulating film IL4. Although the wiring M1 is formed by a single damascene method, the wirings M2 and M3 can be formed by the single damascene method or dual damascene method.

Note that a via for coupling the wiring M1 to the wiring M2 is formed in the interlayer insulating film IL3 between the wirings M1 and M2, while another via for coupling the wiring M2 to the wiring M3 is formed in the interlayer insulating film IL4 between the wirings M3 and M2. When the wiring M2 is formed by the dual damascene method, the via for coupling the wiring M1 to the wiring M2 is simultaneously formed integrally with the wiring M2. When the wiring M2 is formed by the single damascene method, the via for coupling the wiring M1 to the wiring M2 is formed separately from the wiring M2. Likewise, when the wiring M3 is formed by the dual damascene method, the via for coupling the wiring M2 to the wiring M3 is simultaneously formed integrally with the wiring M3. When the wiring M3 is formed by the single damascene method, the via for coupling the wiring M2 to the wiring M3 is formed separately from the wiring M3.

Next, as shown in FIG. 5, the microlens ML is attached as an on-chip lens over the uppermost interlayer insulating film IL4 to overlap with the n-type semiconductor region NW forming the photodiode PD in the planar view. Note that a color filter may be provided between the microlens ML and the interlayer insulating film IL4. If not necessary, the attachment of the microlens ML can also be omitted.

Through the steps described above, the semiconductor device of the first embodiment can be manufactured.

<Main Features and Effects of First Embodiment>

The surface layer located over the charge storage layer of the photodiode PD is included of the low-concentration sub-region PR1 and the high-concentration sub-region PR2. The low-concentration sub-region PR1 is arranged closer to the gate electrode Gt (or floating diffusion FD) of the transfer transistor TX than the high-concentration sub-region PR2. The surface layer (p-type semiconductor layer PR) can be formed widely (particularly, close to the gate electrode Gt) at the main surface of the semiconductor substrate SB in the region with the photodiode PD formed therein, thereby reducing dark current and white defects in dark time.

The low-concentration sub-region PR1 is located close to the gate electrode Gt, which can prevent the degradation of transmission characteristics of charges that are transferred from the charge storage layer of the photodiode PD to the floating diffusion FD of the transfer transistor TX.

The surface layer over the charge storage layer of the photodiode PD is included of the low-concentration sub-region PR1 and the high-concentration sub-region PR2, in which the low-concentration sub-region PR1 is formed more deeply than the high-concentration sub-region PR2, and the low-concentration sub-region PR1 is in contact with the n-type semiconductor region NW. Thus, the reduction in saturated charges of the n-type semiconductor region NW as the charge storage layer can be prevented.

The sub-regions PR1 and PR2 are formed by the oblique ion implantation at different implantation angles, using the gate electrode Gt as a mask, thereby enabling improvement of the positional accuracy of the sub-regions PR1 and PR2.

The ion implantation for forming the sub-regions PR1 and PR2 uses the gate electrode Gt as a common (the same) mask, and thus can decrease the number of manufacturing steps.

Second Embodiment

Figure 25:
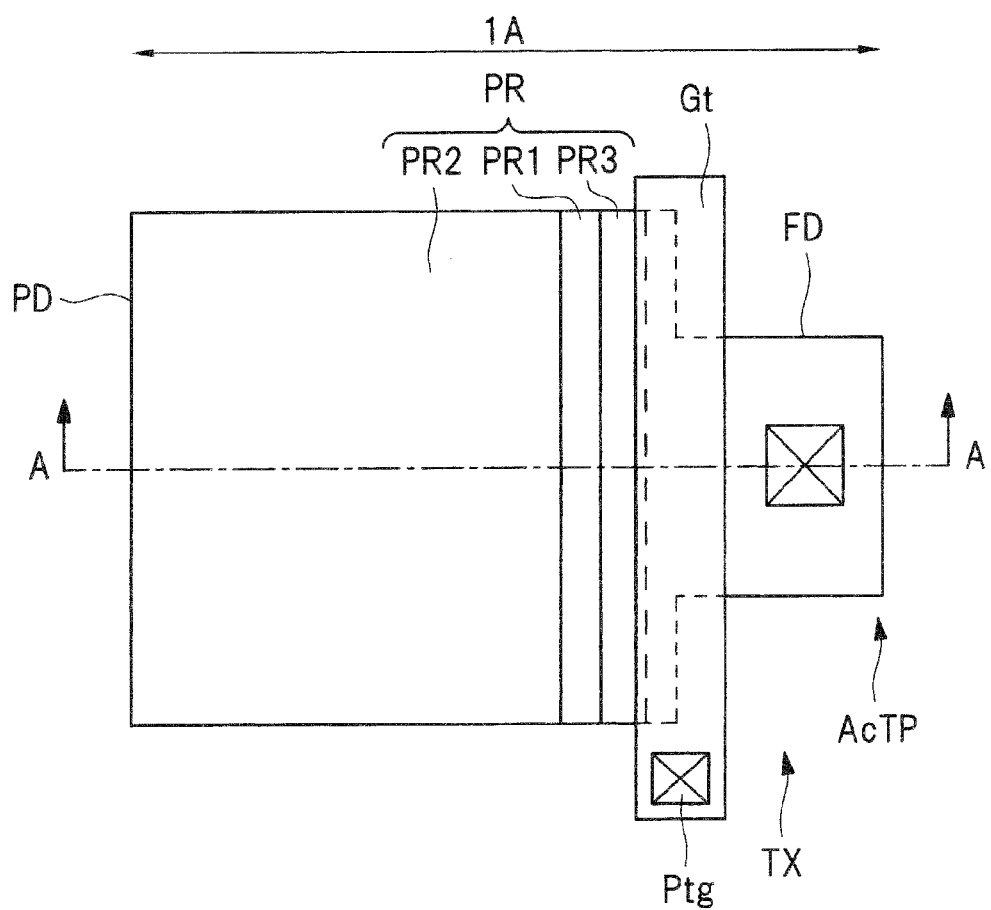
FIG. 25 is a plan view showing a photodiode PD and a transfer transistor TX which are parts of a pixel in a semiconductor device according to a second embodiment of the invention.
Figure 26:
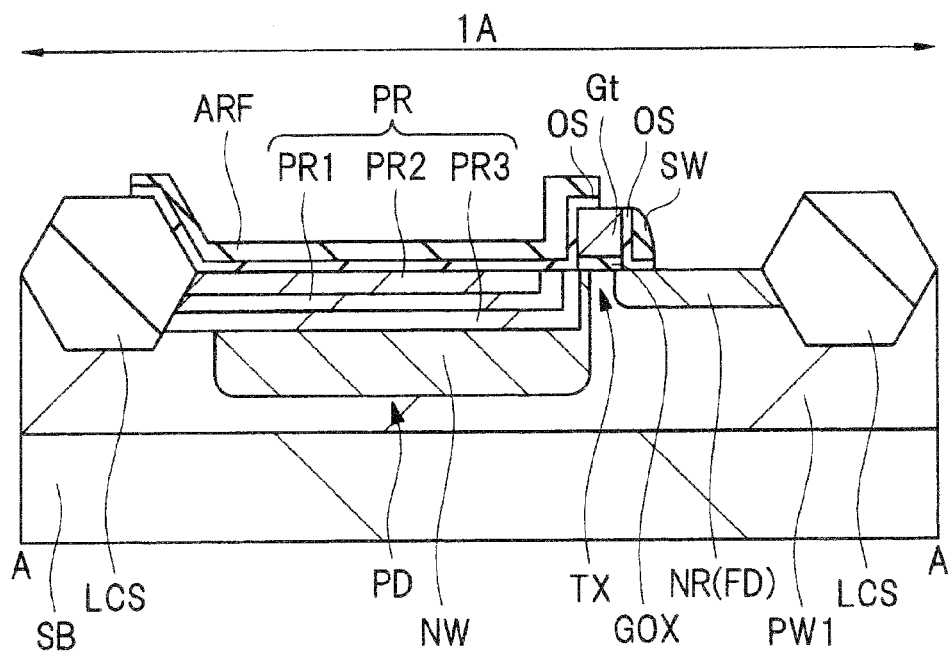
FIG. 26 is a cross-sectional view taken along the line A-A of FIG. 25.

A second embodiment of the invention corresponds to a modified example of the first embodiment. In the second embodiment, the surface layer of the photodiode PD is included of sub-regions PR1, PR2, and PR3. FIG. 25 shows a plan view of the photodiode PD and the transfer transistor TX which are included in the pixel of the semiconductor device according to the second embodiment. Like the first embodiment, as illustrated in the figure, the sub-regions PR1, PR2, and PR3 form the surface layer that serves as a p-type semiconductor region of the photodiode PD. FIG. 26 is a cross-sectional view of the semiconductor device in the second embodiment, and corresponds to the cross-sectional view taken along the line A-A of FIG. 25.

Referring to FIGS. 25 and 26, the surface layer of the photodiode PD is included of sub-regions PR1, PR2, and PR3. The sub-region PR3 is the p-type semiconductor region whose impurity concentration is lower than that of the sub-region PR1. The sub-region PR3 is arranged in the main surface direction and depth direction of the semiconductor substrate SB to cover the sub-region PR1. The bottom surface of the sub-region PR3 is deeper than the bottom surface of the sub-region PR1. The end of the sub-region PR3 on the side of the gate electrode Gt is arranged closer to the gate electrode Gt (or floating diffusion FD) than the end of the sub-region PR1 on the side of the gate electrode Gt. The end of the sub-region PR3 on the side of the gate electrode Gt enters under the gate electrode Gt. Under the gate electrode Gt, the sub-region PR3 is covered with the n-type semiconductor region NW. That is, the n-type semiconductor region NW is arranged between the sub-region PR3 and the p-type well PW1.

Figure 27:
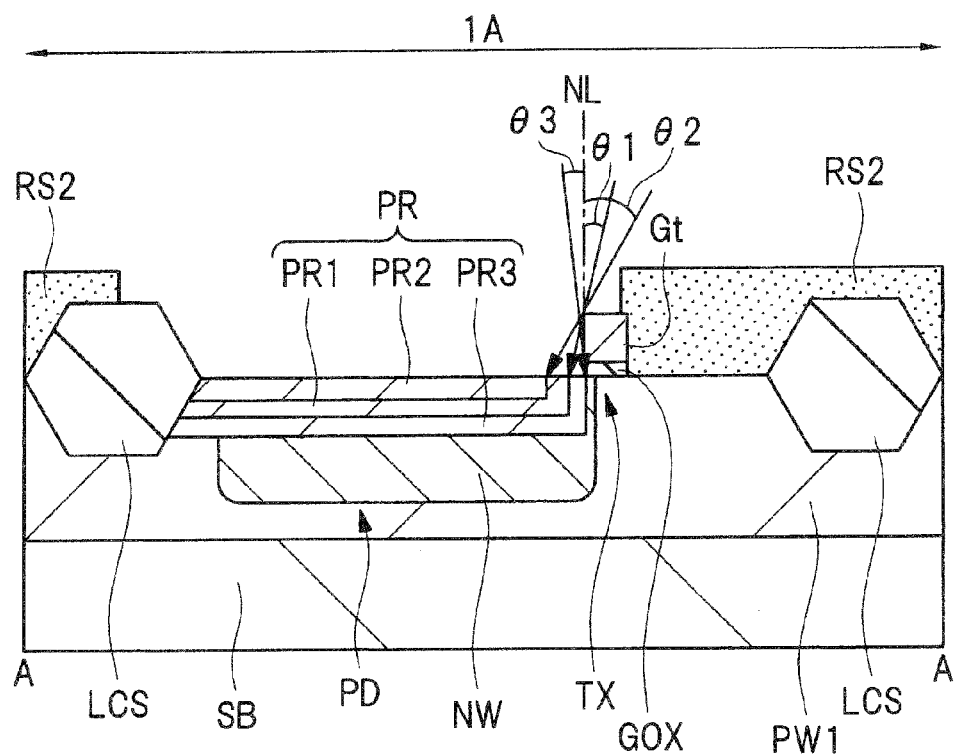
FIG. 27 is a cross-sectional view of a step of the manufacturing procedure for the semiconductor device in the second embodiment.

FIG. 27 is a cross-sectional view showing a step of forming the sub-region PR3, and corresponds to the step of forming the p-type semiconductor region PR (step S6 shown in FIG. 7) in the first embodiment. That is, after the formation of the sub-regions PR1 and PR2 in the first embodiment, the sub-region PR3 is formed. The sub-region PR3 is formed by introducing impurities, such as boron (B), into the semiconductor substrate SB by the oblique ion implantation at an inclination of an implantation angle θ3 (of 2° to 4°) relative to the normal line NL to the main surface of the semiconductor substrate SB. At this time, the amount of implantation of the impurities is, for example, $2 \times 10^{12}$ $cm^{-2}$, and an implantation energy is, for example, 5 keV. The implantation angle θ3 is inclined in an opposite direction to the implantation angles θ1 and θ2 of the sub-region PR1 and PR2, and toward the source with respect to the normal line NL. Note that the photoresist pattern RS2 that is left in formation of the sub-regions PR1 and PR2 can be used as it is. The implantation angle θ3 in the sub-region PR3 is set smaller than the implantation angle θ1 in the sub-region PR1, and the depth of the sub-region PR3 is deeper than that of the sub-region PR1. Note that the sub-region PR3 has its lower concentration than that of each of the sub-regions PR1 and PR2. Thus, the sub-region PR3 substantially acts on only the vicinity of the gate electrode Gt, in which the sub-regions PR1 and PR2 are not formed.

In addition to the effects described in the first embodiment, the second embodiment of the invention can obtain the following effects.

The sub-region PR3 having a lower concentration is formed closer to the gate electrode Gt than the sub-region PR1, which can prevent the degradation of transfer characteristics of the charges in the transfer transistor TX.

Further, the provision of the sub-region PR3 as the p-type semiconductor region on the side of the gate electrode Gt in the sub-region PR1 can reduce dark current and white defects in dark time.

Third Embodiment

Figure 28:
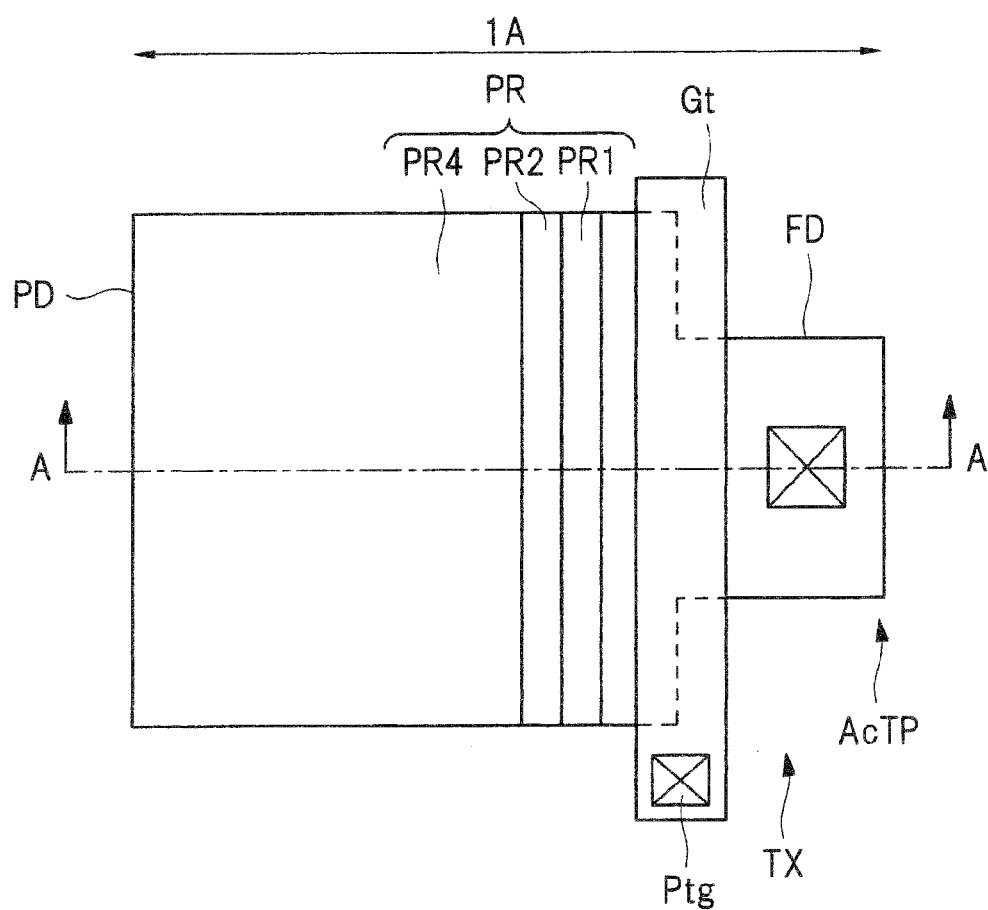
FIG. 28 is a plan view showing a photodiode PD and a transfer transistor TX which are parts of a pixel in a semiconductor device according to a third embodiment of the invention.
Figure 29:
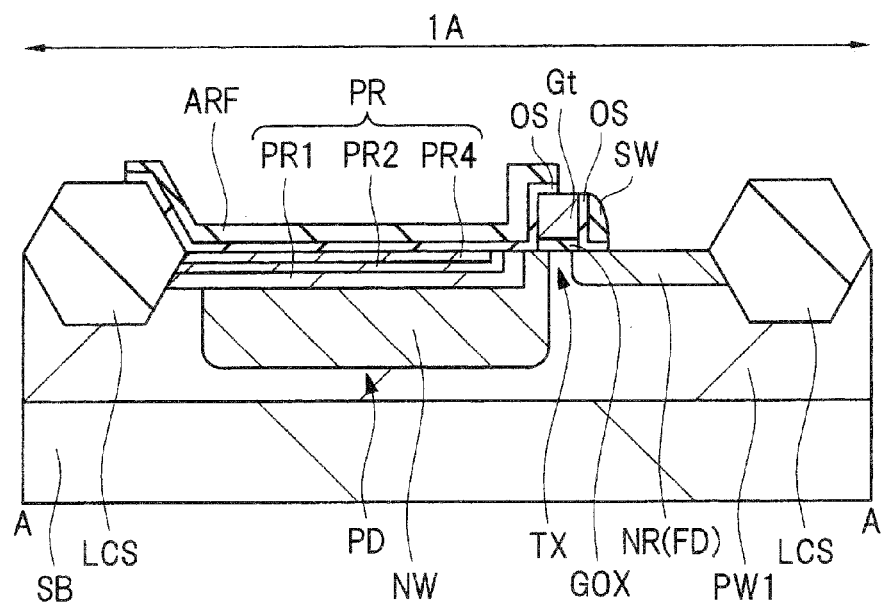
FIG. 29 is a cross-sectional view taken along the line A-A of FIG. 28.
Figure 30:
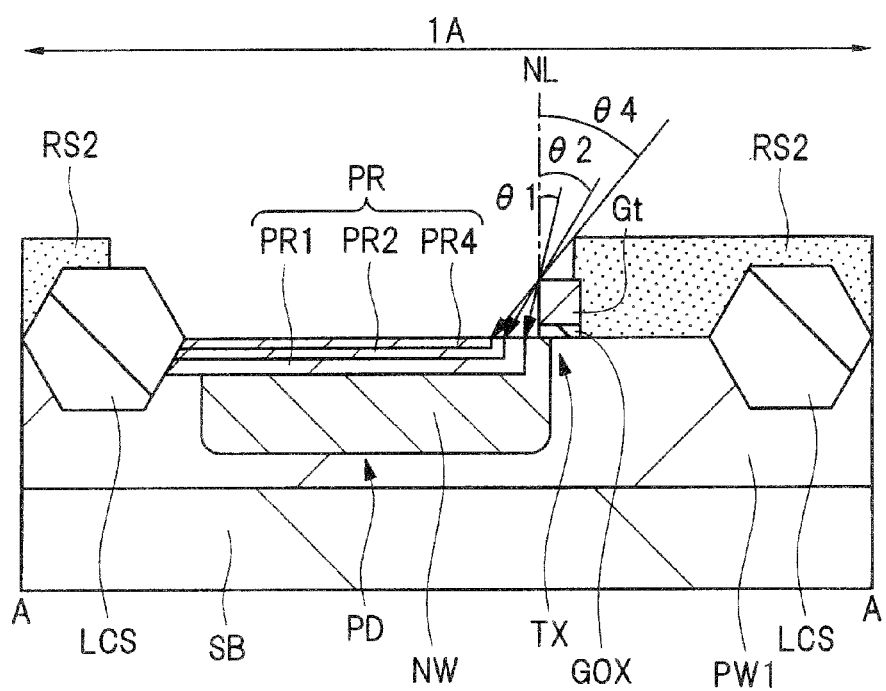
FIG. 30 is a cross-sectional view of a step of the manufacturing procedure for the semiconductor device in the third embodiment.

A third embodiment of the invention corresponds to a modified example of the first embodiment. In the third embodiment, the surface layer of the photodiode PD is included of sub-regions PR1, PR2, and PR4. FIG. 28 shows a plan view of the photodiode PD and the transfer transistor TX which are included in the pixel of the semiconductor device in the third embodiment. Like the first embodiment, as illustrated in the figure, the sub-regions PR1, PR2, and PR4 form the surface layer that serves as a p-type semiconductor region of the photodiode PD. FIG. 29 is a cross-sectional view of the semiconductor device in the third embodiment, and corresponds to the cross-sectional view taken along the line A-A of FIG. 28. FIG. 30 is a cross-sectional view of a step of the manufacturing procedure for the semiconductor device in the third embodiment, and corresponds to the cross-sectional view taken along the line A-A of FIG. 28.

Referring to FIGS. 28 and 29, the surface layer of the photodiode PD is included of sub-regions PR1, PR2, and PR4. The sub-region PR4 is covered with the sub-region PR2, and the sub-region PR2 is covered with the sub-region PR1, in the main surface direction and depth direction of the semiconductor substrate SB. The sub-region PR4 is the p-type semiconductor region whose impurity concentration is higher than that of the sub-region PR1 or sub-region PR2. The bottom surface of the sub-region PR4 is formed more shallowly than the bottom surface of the sub-region PR2. Further, the end of the sub-region PR4 on the gate electrode Gt side is located farther away from the gate electrode Gt (or floating diffusion FD) than the end of each of the sub-regions PR1 and PR2 on the gate electrode Gt side.

FIG. 30 is a cross-sectional view showing a step of forming the sub-region PR4, and corresponds to the step of forming the p-type semiconductor region PR (step S6 shown in FIG. 7) in the first embodiment. That is, after the formation of the sub-regions PR1 and PR2 in the first embodiment, the sub-region PR4 is formed. The sub-region PR4 is formed by introducing impurities, such as boron (B), into the semiconductor substrate SB by the oblique ion implantation at an inclination of an implantation angle $\theta 4$ relative to the normal line NL to the main surface of the semiconductor substrate SB. The implantation angle $\theta 4$ is larger than the implantation angle $\theta 2$. At this time, the amount of implantation of impurities is, for example, $2 \times 10^{12}$ cm$^{-2}$, and an implantation energy is, for example, 5 keV. Note that the photoresist pattern RS2 that is left in formation of the sub-regions PR1 and PR2 can be used as it is. The implantation angle in the ion implantation for forming the sub-region PR4 is set larger than the implantation angle $\theta 2$ for forming the sub-region PR2, whereby the sub-region PR4 is shallower than the sub-region PR2. The amount of implantation of impurities for formation of the sub-region PR4 is lower than each of the amount of implantation of impurities for formation of the sub-region PR2 ($2 \times 10^{13}$ cm$^{-2}$), and the amount of implantation of impurities for formation of the sub-region PR1 ($1 \times 10^{13}$ cm$^{-2}$). However, since the sub-region PR4 overlaps with the sub-region PR1 and sub-region PR2, the concentration of impurities in the sub-region PR4 is higher than that of impurities in the sub-region PR2.

In addition to the effects described in the first embodiment, the third embodiment of the invention can obtain the following effects.

The provision of the sub-region PR4 causes the low-concentration sub regions PR2 and PR1 to be positioned closer to the side of the gate electrode Gt, and thus can reduce dark current and white defects in dark time.

The concentration of impurities in the p-type semiconductor region forming the surface layer is gradually decreased from the center of the photodiode PD toward the gate electrode Gt of the transfer transistor TX, which makes it easier to transfer charges of the charge storage layer of the photodiode PD toward the transfer transistor TX.

Fourth Embodiment

Figure 31:
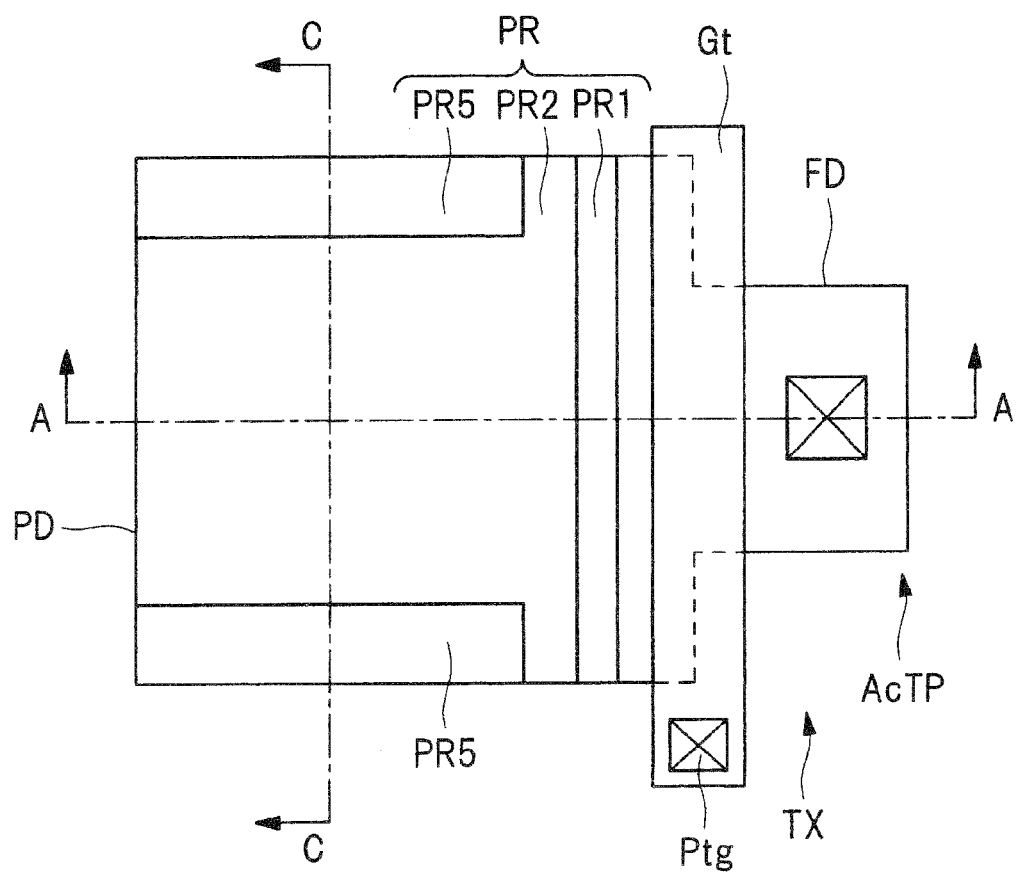
FIG. 31 is a plan view showing a photodiode PD and a transfer transistor TX which are parts of a pixel in a semiconductor device according to a fourth embodiment of the invention.
Figure 32:
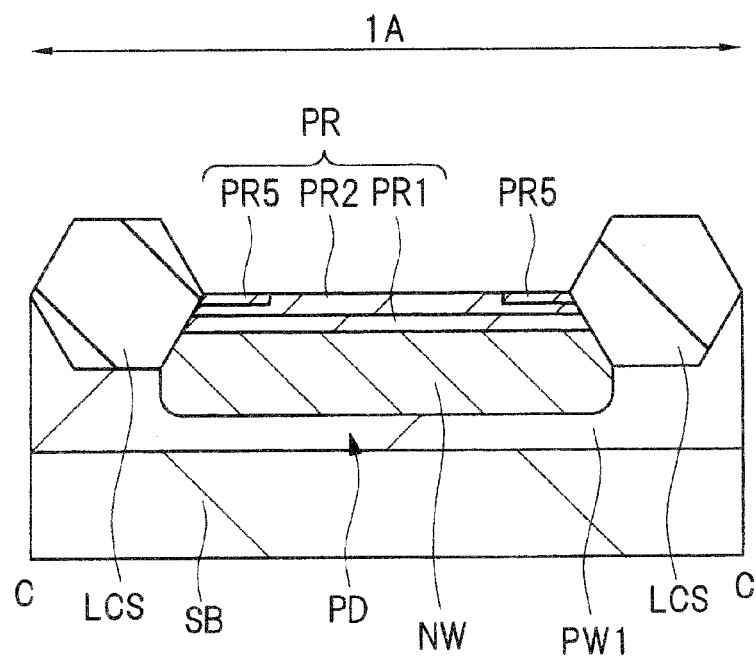
FIG. 32 is a cross-sectional view taken along the line A-A of FIG. 31.

A fourth embodiment of the invention corresponds to a modified example of the first embodiment. In the fourth embodiment, the surface layer of the photodiode PD is included of sub-regions PR1, PR2, and PR5. FIG. 31 shows a plan view of the photodiode PD and the transfer transistor TX which are included in the pixel of the semiconductor device in the fourth embodiment. Like the first embodiment, as illustrated in the figure, the sub-regions PR1, PR2, and PR5 form the surface layer that serves as a p-type semiconductor region of the photodiode PD. FIG. 32 is a cross-sectional view of the semiconductor device in the fourth embodiment, and corresponds to the cross-sectional view taken along the line C-C of FIG. 31.

As shown in FIGS. 31 and 32, the surface layer of the photodiode PD is included of sub-regions PR1, PR2, and PR5. The sub-region PR5 is the p-type semiconductor region that has a higher impurity concentration than that of the sub-region PR2, and which is shallower than the sub-region PR2. A pair of sub-regions PR5 is formed on both ends of the region with the photodiode PD formed therein, in the gate width direction of the transfer transistor TX. In other words, the sub-region PR5, the sub-region PR2, and the sub-region PR5 are arranged in this order in the direction of the channel width of the transfer transistor TX. Therefore, in the gate width direction of the transfer transistor TX, there is a potential distribution where the charges positioned around the photodiode PD are more likely to move toward the center of the transistor. In the gate length direction of the transfer transistor TX, the sub-region PR5, the sub-region PR2, and the sub-region PR1 are arranged in this order toward the gate electrode Gt around the photodiode PD, while the sub-region PR2 and the sub-region PR1 are arranged in this order toward the gate electrode Gt at the center of the photodiode PD. That is, in the gate length direction, there is a potential distribution where the charges of the charge storage layer are more likely to move toward the gate electrode Gt. Thus, the charges of the charge storage layer in the photodiode PD can be effectively transferred to the floating diffusion FD by the transfer transistor TX without wasting any charge.

In addition to the effects described in the first embodiment, the fourth embodiment of the invention can obtain the above-mentioned effects.

Fifth Embodiment

A fifth embodiment of the invention corresponds to a modified example of the method for manufacturing a semiconductor device in the first embodiment. In the first embodiment, as described with reference to FIG. 17, the sub-regions PR1 and PR2 forming the p-type semiconductor region PR as the surface layer are formed in different ion implantation steps (in step S6 of FIG. 7). In the fifth embodiment, the sub-regions PR6 and PR7 forming the surface layer are formed in one ion implantation step.

A manufacturing method of a semiconductor device in the fifth embodiment is made by replacing the manufacturing method of the pixel region 1A in steps S4 to S6 of FIG. 7 in the first embodiment as follows. FIGS. 33 to 38 are cross-sectional views showing manufacturing steps of the pixel region 1A of the semiconductor device in the fifth embodiment.

Figure 33:
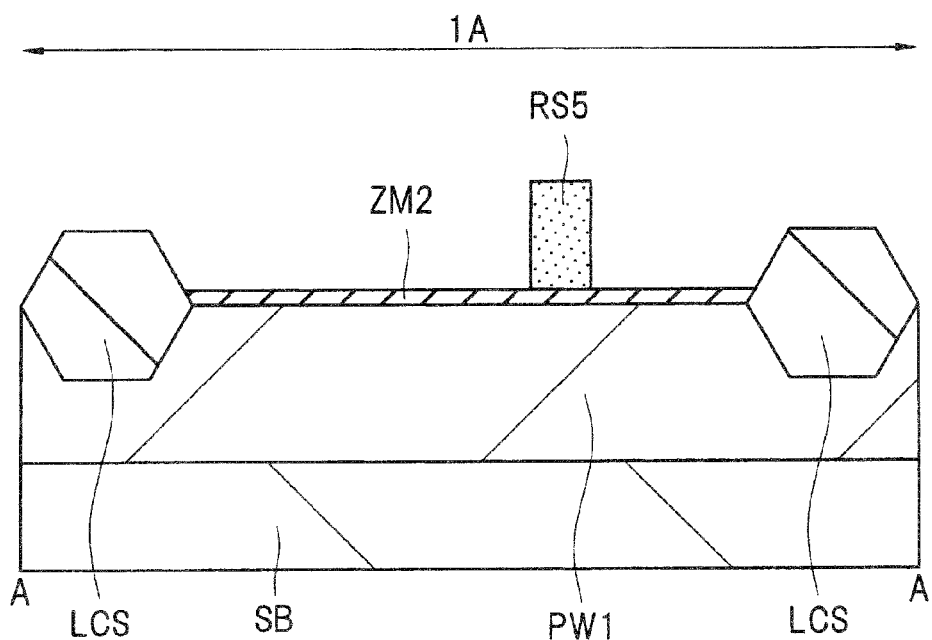
FIG. 33 is a cross-sectional view of a step of the manufacturing procedure for the semiconductor device according to a fifth embodiment of the invention.

FIG. 33 illustrates the step of formation of an insulating film ZM2. After completion of the step S3 shown in FIG. 7, as shown in FIG. 33, the insulating film ZM2 is formed over the main surface of the semiconductor substrate SB. The insulating film ZM2 is made of, e.g., a silicon oxide film, and has its thickness equal to or more than the thickness of the gate insulating film GOX in the transfer transistor TX. Then, a photoresist pattern (photoresist layer) RS5 is formed over the insulating film ZM2.

Figure 34:
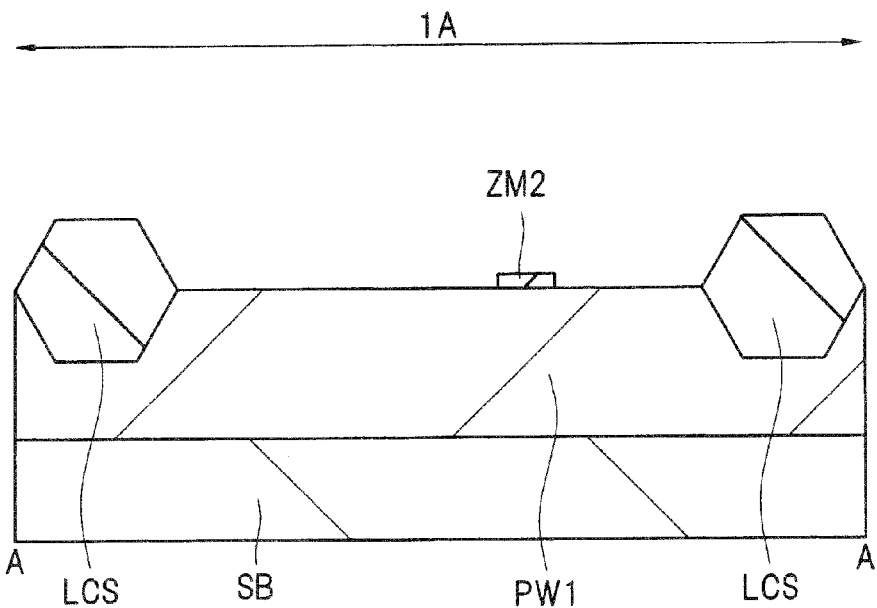
FIG. 34 is a cross-sectional view of another step of the manufacturing procedure for the semiconductor device, following the step shown in FIG. 33.

Next, as shown in FIG. 34, the insulating film ZM2 is subjected to, for example, dry-etching by using the photoresist pattern RS5 as a mask, thereby forming a patterned insulating film ZM2 over the main surface of the semiconductor substrate SB. The patterned insulating film ZM2 has one end and the other end thereof oriented in the gate length direction of the transfer transistor TX. After the dry-etching, the photoresist pattern RS5 is removed.

Figure 35:
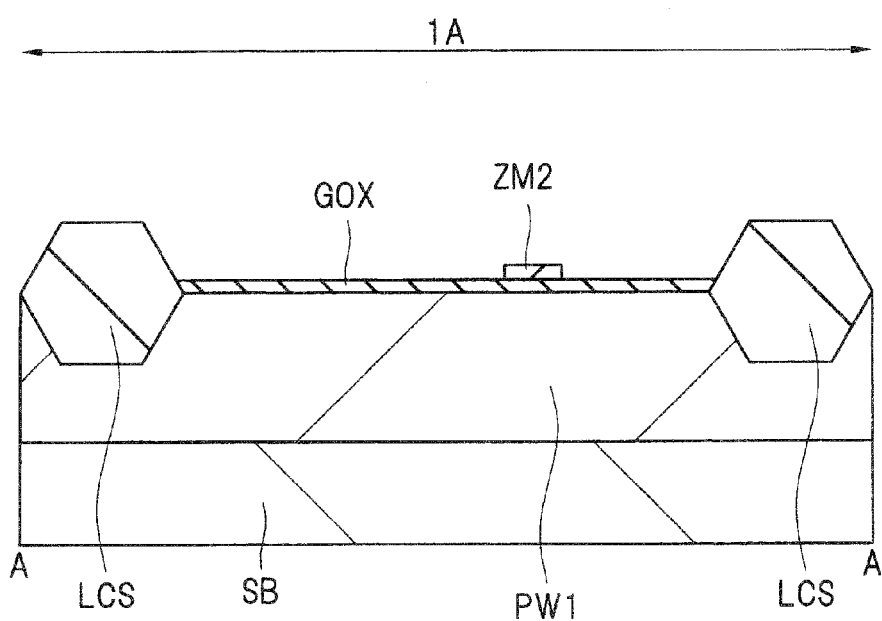
FIG. 35 is a cross-sectional view of another step of the manufacturing procedure for the semiconductor device, following the step shown in FIG. 34.
Figure 36:
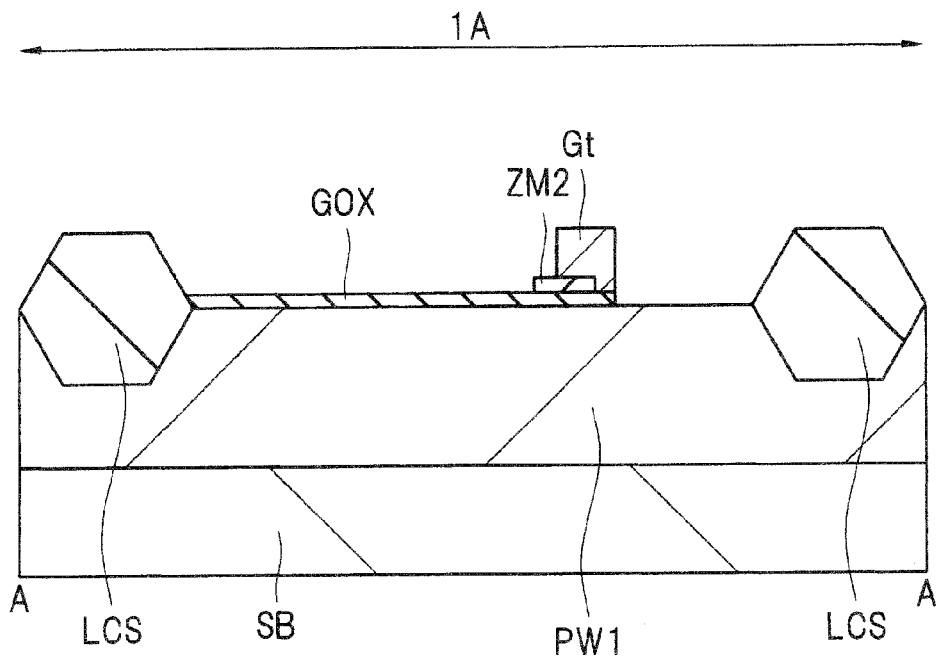
FIG. 36 is a cross-sectional view of another step of the manufacturing procedure for the semiconductor device, following the step shown in FIG. 35.

FIG. 35 illustrates the step of formation of the gate insulating film GOX in the transfer transistor TX, and FIG. 36 illustrates the step of formation of the gate electrode Gt in the transfer transistor TX. FIG. 36 corresponds to FIG. 13 (step S4 of FIG. 7) in the first embodiment. As shown in FIG. 35, the gate insulating film GOX having a desired thickness is formed over the main surface of the semiconductor substrate SB. The gate insulating film GOX is formed, for example, by oxidizing the main surface of the semiconductor substrate SB, whereby the gate insulating film GOX is also formed between the insulating film ZM2 and the main surface of the semiconductor substrate SB. Therefore, a region where the insulating film ZM2 exists has a laminated structure included of the gate insulating film GOX and the insulating film ZM2, and thus has a larger thickness of these insulating films than a region where the insulating film ZM2 does not exist.

FIG. 36 illustrates the step of formation of the gate electrode Gt. As described in FIG. 13, although the gate electrode Gt is formed over the insulating film ZM2 and the gate insulating film GOX, the gate electrode Gt is arranged to expose one end of the insulating film ZM2. Note that like the first embodiment described above, the insulating film GOX in the region not covered with the gate electrode Gt may be maintained without being removed.

Figure 37:
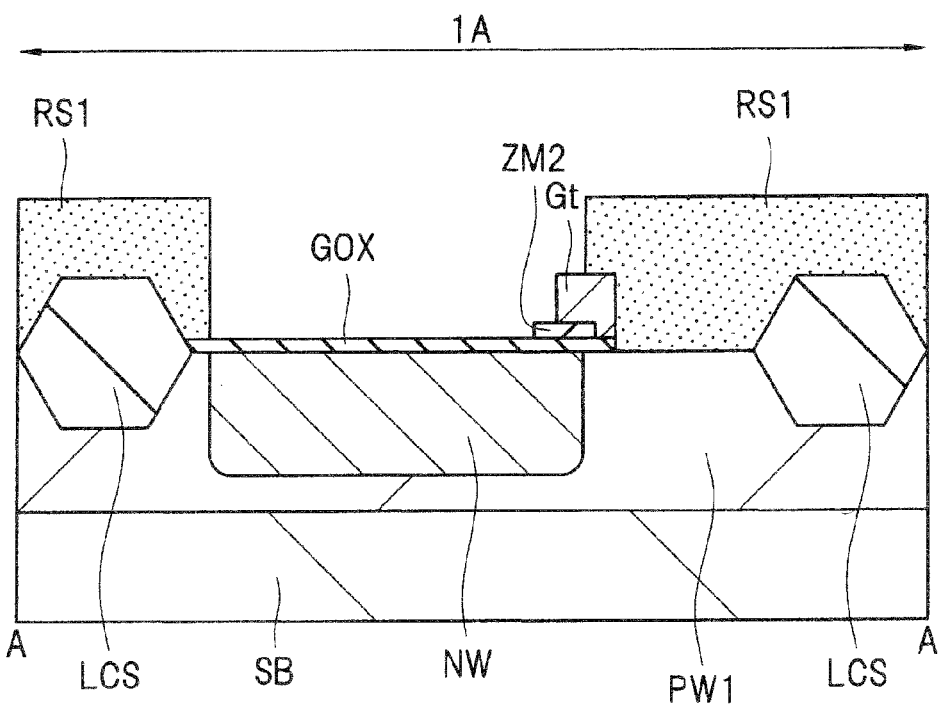
FIG. 37 is a cross-sectional view of another step of the manufacturing procedure for the semiconductor device, following the step shown in FIG. 36.

FIG. 37 illustrates the step of formation of the n-type semiconductor region NW (corresponding to step S5 shown in FIG. 7). As mentioned above using FIG. 15, n-type impurities, such as phosphorus (P) or arsenic (As), are ion-implanted into the semiconductor substrate SB in the pixel region 1A to thereby form the n-type semiconductor region NW. The photoresist pattern RS1 is the same as that described in FIG. 15.

Figure 38:
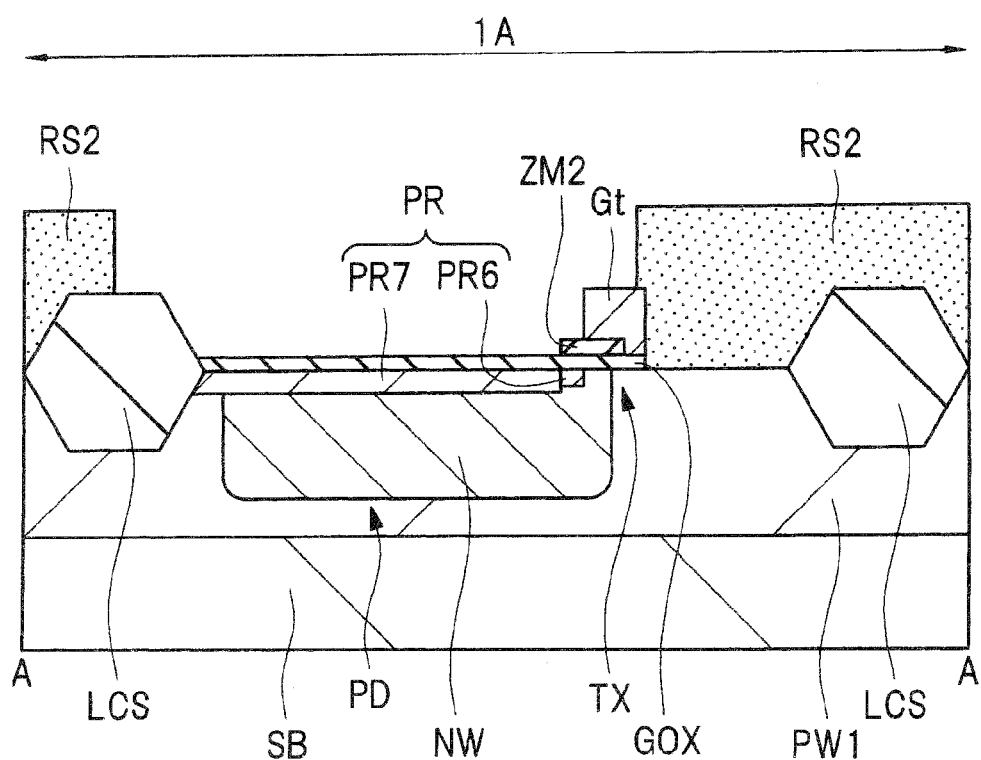
FIG. 38 is a cross-sectional view of another step of the manufacturing procedure for the semiconductor device, following the step shown in FIG. 37.

FIG. 38 illustrates the step of formation of the p-type semiconductor region PR serving as the surface layer of the photodiode PD (which corresponds to step S6 in FIG. 7). The photoresist pattern RS2, which is described using FIG. 17, is formed over the semiconductor substrate SB, and then impurities, such as boron (B), are ion-implanted into the semiconductor substrate SB. The ion implantation is performed in the normal line direction relative to the main surface of the semiconductor substrate SB. By the above ion implantation, the p-type semiconductor region PR included of the sub-regions PR6 and PR7 is formed in the pixel region 1A. The sub-region PR7 is formed over the main surface of the semiconductor substrate SB by allowing impurities to pass through the single-layer insulating film (gate insulating film GOX). On the other hand, the sub-region PR6 is formed over the main surface of the semiconductor substrate SB by allowing impurities to pass through the laminated insulating film (included of the gate insulating film GOX and the insulating film ZM2). Here, the concentration of impurities in the sub-region PR7 is set higher than that in the sub-region PR6. Since the laminated insulating film is arranged on the side of the gate electrode Gt, the sub-region PR6 having a low impurity concentration is formed closer to the side of the gate electrode Gt than the sub-region PR7 having a high impurity concentration, and is also shallower than the sub-region PR7.

Thereafter, by performing steps after the step S7 shown in FIG. 7, the semiconductor device of the fifth embodiment is completed.

In addition to the effects described in the first embodiment, the fifth embodiment of the invention can obtain the following effects.

In this way, the ion implantation is performed using the insulating films with different thicknesses, which can simultaneously form the regions with different impurity concentrations by one ion implantation process.

Although the invention made by the inventors have been specifically described based on the embodiments, it is to be understood that the invention is not limited to the embodiments disclosed, and that various modifications and changes can be made to those embodiments without departing from the scope of the invention.

The embodiments of the invention can also be applied, for example, to a backside-illumination type CMOS image sensor.

What is claimed is:
1. A semiconductor device, comprising a photodiode, and a transfer transistor, the photodiode and the transfer transistor being coupled in series, the transfer transistor comprising:
   a gate electrode formed over a main surface of a semiconductor substrate via a gate insulating film;
   a source region of a first conductivity type arranged on one end side of the gate electrode; and
   a drain region of the first conductivity type arranged on the other end side of the gate electrode, and
   the photodiode comprising:
   a charge storage layer of the first conductivity type formed in the semiconductor substrate, and also serving as the source region; and
   a surface layer of a second conductivity type arranged over the charge storage layer, the second conductivity type being opposite to the first conductivity type, wherein the surface layer comprises a first sub-region having a low impurity concentration, and a second sub-region having a higher impurity concentration than that of the first sub-region, the first sub-region being positioned closer to the drain region than the second sub-region, and
   wherein at least a portion of a lower surface of the first sub-region being in direct contact with the charge storage layer.
2. The semiconductor device according to claim 1, wherein the first sub-region has an end thereof on a side of the drain region covered with the charge storage layer.
3. The semiconductor device according to claim 2, wherein the second sub-region has a lower surface thereof covered with the first sub-region.

4. A semiconductor device, comprising a photodiode, and a transfer transistor, the photodiode and the transfer transistor being coupled in series, the transfer transistor comprising:
- a gate electrode formed over a main surface of a semiconductor substrate via a gate insulating film;
- a source region of a first conductivity type arranged on one end side of the gate electrode; and
- a drain region of the first conductivity type arranged on the other end side of the gate electrode, and the photodiode comprising:
- a charge storage layer of the first conductivity type formed in the semiconductor substrate, and also serving as the source region; and
- a surface layer of a second conductivity type arranged over the charge storage layer, the second conductivity type being opposite to the first conductivity type, wherein the surface layer comprises a first sub-region having a low impurity concentration, a second sub-region having a higher impurity concentration than that of the first sub-region, and a third sub-region of the second conductivity type, the first sub-region being positioned closer to the drain region then the second sub-region, and the third sub-region being arranged closer to the drain region than the first sub-region.

5. The semiconductor device according to claim 4, wherein the third sub-region has an end thereof on the side of the drain region covered with the charge storage layer.

6. The semiconductor device according to claim 4, wherein a part of the third sub-region overlaps with the gate electrode in a plan view.

7. The semiconductor device according to claim 4, wherein the first sub-region has a lower surface thereof covered with the third sub-region.

8. A semiconductor device, comprising a photodiode, and a transfer transistor, the photodiode and the transfer transistor being coupled in series, the transfer transistor comprising:
- a gate electrode formed over a main surface of a semiconductor substrate via a gate insulating film;
- a source region of a first conductivity type arranged on one end side of the gate electrode; and
- a drain region of the first conductivity type arranged on the other end side of the gate electrode, and the photodiode comprising:

a charge storage layer of the first conductivity type formed in the semiconductor substrate, and also serving as the source region; and a surface layer of a second conductivity type arranged over the charge storage layer, the second conductivity type being opposite to the first conductivity type, wherein the surface layer comprises a first sub-region having a low impurity concentration, and a second sub-region having a higher impurity concentration than that of the first sub-region, the first sub-region being positioned closer to the drain region than the second sub-region, wherein the first sub-region has an end thereof on a side of the drain region covered with the charge storage layer, and wherein the second sub-region has a lower surface thereof covered with the first sub-region.

* * * * *